United States Patent
Ravensbergen et al.

(10) Patent No.: US 10,444,640 B2
(45) Date of Patent: Oct. 15, 2019

(54) METROLOGY APPARATUS, LITHOGRAPHIC SYSTEM, AND METHOD OF MEASURING A STRUCTURE

(71) Applicant: ASML NETHERLANDS B.V., Veldhoven (NL)

(72) Inventors: Janneke Ravensbergen, Eindhoven (NL); Duygu Akbulut, Eindhoven (NL); Nitesh Pandey, Eindhoven (NL); Jin Lian, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/159,080

(22) Filed: Oct. 12, 2018

(65) Prior Publication Data

US 2019/0113852 A1 Apr. 18, 2019

(30) Foreign Application Priority Data

Oct. 16, 2017 (EP) .................... 17196670

(51) Int. Cl.
*G01B 11/00* (2006.01)
*G03F 7/20* (2006.01)
*G01B 9/02* (2006.01)

(52) U.S. Cl.
CPC ....... *G03F 7/70633* (2013.01); *G01B 9/0209* (2013.01); *G01B 9/02083* (2013.01); *G03F 7/70625* (2013.01)

(58) Field of Classification Search
CPC ......... G01B 11/27; G01B 11/272; G03F 9/70; G03F 7/70358; H01L 21/681

(Continued)

(56) References Cited

U.S. PATENT DOCUMENTS

2008/0266561 A1 10/2008 Kandel et al.
2011/0032535 A1 2/2011 Liesener et al.
(Continued)

FOREIGN PATENT DOCUMENTS

WO 2016096310 6/2016

OTHER PUBLICATIONS

International Search Report and Written Opinion issued in corresponding PCT Patent Application No. PCT/EP2017/077505, dated Nov. 6, 2018,.

(Continued)

*Primary Examiner* — Md M Rahman
(74) *Attorney, Agent, or Firm* — Pillsbury Winthrop Shaw Pittman LLP

(57) ABSTRACT

A metrology apparatus is disclosed that has an optical system to focus radiation onto a structure and directs redirected radiation from the structure to a detection system. The optical system applies a plurality of different offsets of an optical characteristic to radiation before and/or after redirected by the structure, such that a corresponding plurality of different offsets are provided to redirected radiation derived from a first point of a pupil plane field distribution relative to redirected radiation derived from a second point of the pupil plane field distribution. The detection system detects a corresponding plurality of radiation intensities resulting from interference between the redirected radiation derived from the first point of the pupil plane field distribution and the redirected radiation derived from the second point of the pupil plane field distribution. Each radiation intensity corresponds to a different one of the plurality of different offsets.

20 Claims, 13 Drawing Sheets

(58) Field of Classification Search
USPC .......................................................... 356/399
See application file for complete search history.

(56) References Cited

U.S. PATENT DOCUMENTS

2011/0242528 A1* 10/2011 Hwang .............. G01N 21/9501
356/237.2
2013/0044331 A1 2/2013 Manassen et al.
2013/0054186 A1* 2/2013 Den Boef ............. H01L 23/544
702/150

OTHER PUBLICATIONS

European Search Report issued in corresponding European Patent Application No. 17196670, dated Mar. 26, 2018.
Huisman, S.R., et al.: "Programming balanced optical beam splitters in white paint"; Optics Express, vol. 22, No. 7, Jan. 17, 2014, pp. 1-18.
Li, L., et al.: "Symmetries of cross-polarization diffraction coefficients of gratings"; Journal of The Optical Society of America, vol. 17, No. 5, May 2000, pp. 881-887.
Li, D., et al.: "Polarization and Thickness Dependent Absorption Properties of Black Phosphorus: New Saturable Absorber for Ultrafast Pulse Generation", Scientific Reports, Oct. 30, 2015, pp. 1-9.
De Groot, P.: "Phase Shifting Interferometry", Optical Measurement of Surface Topography, Springer, pp. 167-186 (Jan. 2011).
Kim, H., et al.: "Tunable Polarization-Dependent-Loss Element Based on Rotatable Birefringent Prisms and a Half-Wave Plate"; IEEE Photonics Technology Letters, vol. 21, No. 6, Mar. 15, 2009, pp. 374-376.
Taiwanese Office Action issued in corresponding Taiwanese Patent Application No. 107136144, dated Jun. 12, 2019.

* cited by examiner

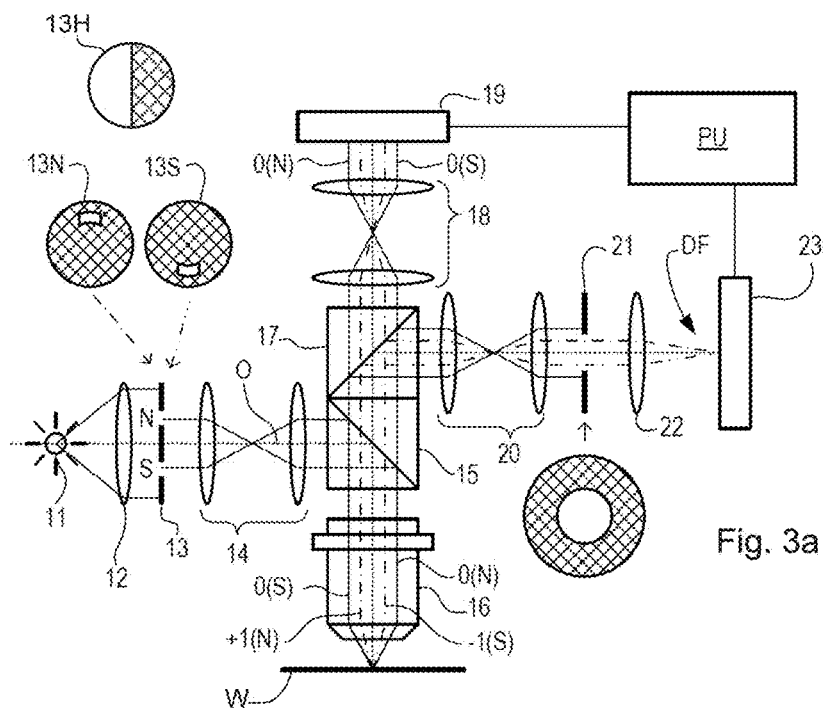
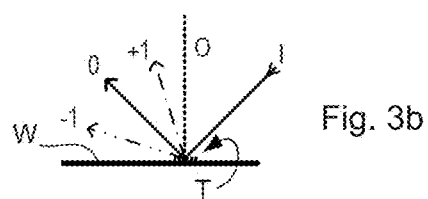
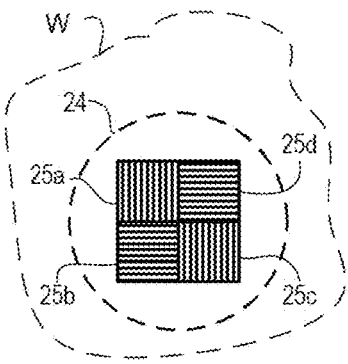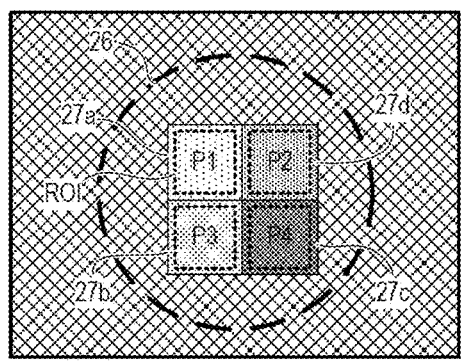
Fig. 3a
Fig. 3b
Fig. 3c
Fig. 3d

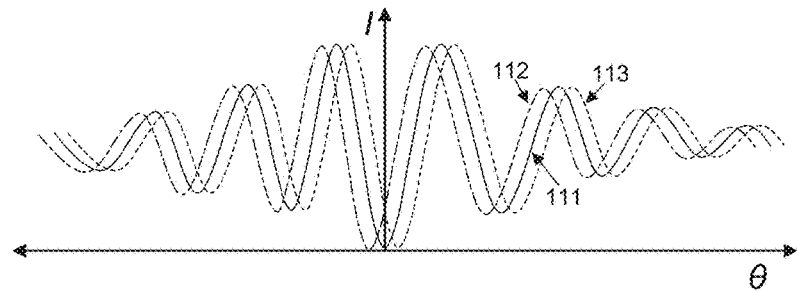
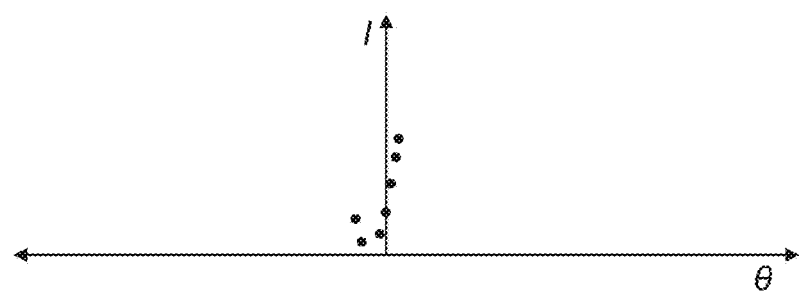
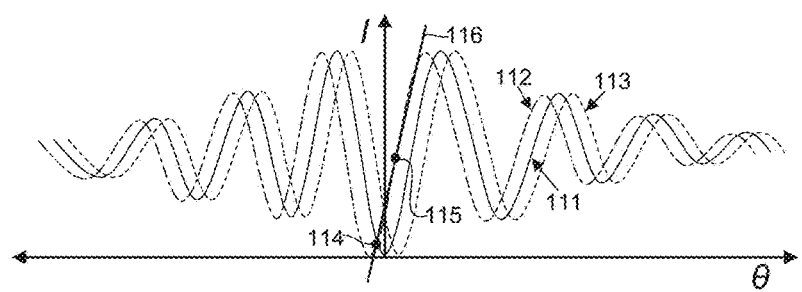

METROLOGY APPARATUS, LITHOGRAPHIC SYSTEM, AND METHOD OF MEASURING A STRUCTURE

This application claims the benefit of priority of European patent application no. 17196670, filed on Oct. 16, 2017. The content of the foregoing application is incorporated herein in its entirety be reference.

FIELD

The present description relates to a metrology apparatus for measuring a structure formed on a substrate by a lithographic process, relates to a lithographic system, and relates to a method of measuring a structure formed on a substrate by a lithographic process.

BACKGROUND

A lithographic apparatus is a machine that applies a desired pattern onto a substrate, usually onto a target portion of the substrate. A lithographic apparatus can be used, for example, in the manufacture of devices such as integrated circuits (ICs). In that instance, a patterning device, which is alternatively referred to as a mask or a reticle, may be used to generate a pattern (e.g., a circuit pattern) to be formed on an individual layer of the device. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers or two structures in a same layer, in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure values of one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of a value of the property of interest may be performed by various techniques: e.g., reconstruction of the target by iterative approaches such as rigorous coupled wave analysis or finite element methods; library searches; and principal component analysis.

In a known metrology technique, the $-1^{st}$ and the $+1^{st}$ diffraction order intensity values are obtained from a target. The intensity asymmetry, a comparison of these diffraction order intensity values, provides a measurement of target asymmetry; that is, asymmetry in the target. This asymmetry in the target can be used as an indicator of overlay (e.g., undesired misalignment of two layers).

SUMMARY

Measurement of overlay (or other asymmetries in target structures) using the above metrology technique can be difficult where the structures concerned are at the resolution of device features to be manufactured. This is because high resolution features cause correspondingly high angles of diffraction, which are difficult to capture, or diffraction orders become evanescent (non-propagating). For structures defined by layers that are very close to each other, such as may be the case after etching has been carried out, it may still be possible to obtain some information about asymmetry from zeroth order scattering. However, it may be difficult to obtain adequate sensitivity in such measurements, particularly, in the context of overlay between layers, where layer separation is not very small.

It is desirable, for example, to improve measurement of target asymmetry or other parameters of interest, particularly for high resolution targets.

According to an aspect, there is provided a metrology apparatus for measuring a structure formed on a substrate to determine a parameter of interest, the metrology apparatus comprising: an optical system configured to focus radiation onto the structure and direct reflected radiation from the structure to a detection system, wherein: the optical system is configured to apply a plurality of different offsets of an optical characteristic to radiation before and/or after reflection from the structure, such that a corresponding plurality of different offsets are provided to reflected radiation derived from a first point of a pupil plane field distribution relative to reflected radiation derived from a second point of the pupil plane field distribution; and the detection system is configured to detect a corresponding plurality of radiation intensities resulting from interference between the reflected radiation derived from the first point of the pupil plane field distribution and the reflected radiation derived from the second point of the pupil plane field distribution, wherein each radiation intensity corresponds to a different one of the plurality of different offsets.

According to an aspect, there is provided a method of measuring a structure formed on a substrate to determine a parameter of interest, the method comprising: focusing radiation onto the structure and using a detection system to detect reflected radiation from the structure, wherein: a plurality of different offsets of an optical characteristic are applied to radiation before and/or after reflection from the structure, such that a corresponding plurality of different offsets are provided to reflected radiation derived from a first point of a pupil plane field distribution relative to reflected radiation derived from a second point of the pupil plane field distribution; and the detection system detects a corresponding plurality of radiation intensities resulting from interference between the reflected radiation derived from the first point of the pupil plane field distribution and the reflected radiation derived from the second point of the pupil plane field distribution, wherein each radiation intensity corresponds to a different one of the plurality of different offsets.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 3a shows a schematic diagram of a metrology apparatus for use in measuring targets using a first pair of illumination apertures;

FIG. 3b shows a schematic depiction of a detail of a diffraction spectrum of a target grating for a given direction of illumination;

FIG. 3c shows a schematic depiction of a known form of multiple grating target and an outline of a measurement spot on a substrate;

FIG. 3d shows a schematic depiction of an image of the target of FIG. 3c obtained in the metrology apparatus of FIG. 3a;

FIG. 10 is a graph depicting a typical variation of signal intensity as a function of an applied phase offset for targets with different overlay;

FIG. 11 is a graph depicting example measurements of signal intensity for a plurality of discrete applied phase offsets;

FIG. 12 is a graph depicting example measurements of signal intensity including at least one negative applied phase offset and at least one positive applied phase offset, and a best fit line;

DETAILED DESCRIPTION OF EXEMPLARY EMBODIMENTS

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Figure 1:
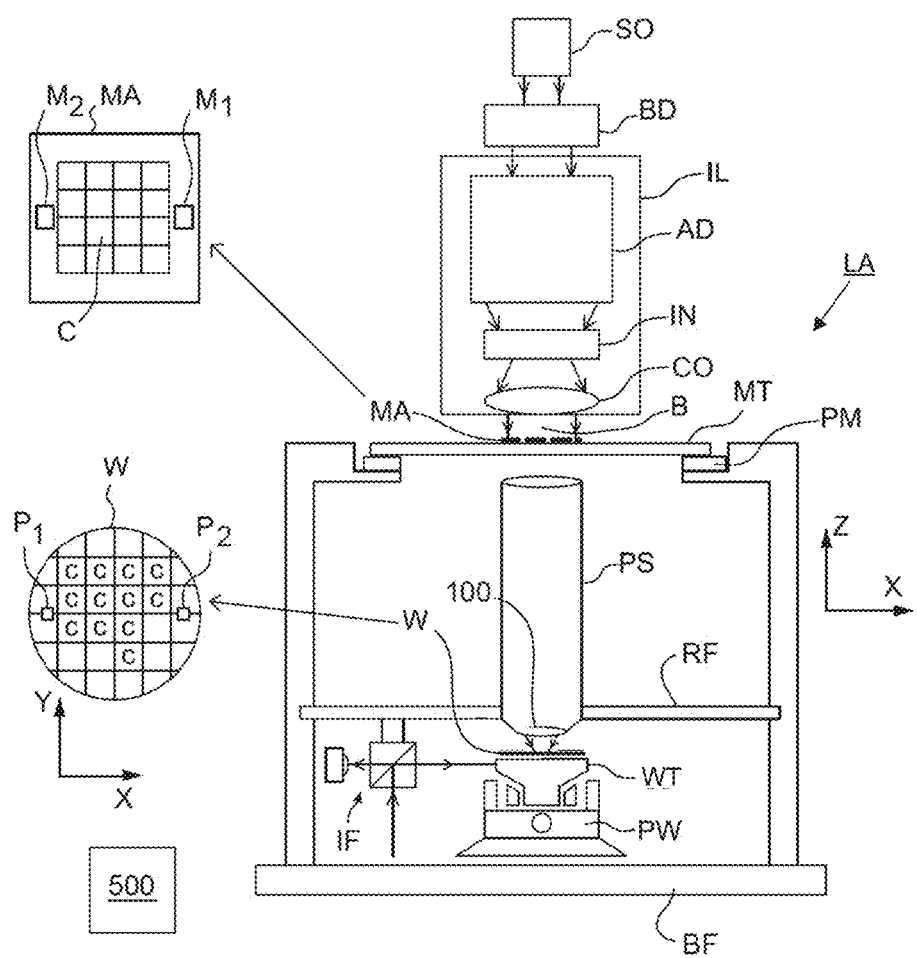
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic, or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing various types of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

In this embodiment, for example, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables and, for example, two or more patterning device tables. In such "multiple stage" machines the one or more additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (which are commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam to have a desired uniformity and intensity distribution in its cross section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g., after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e., a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
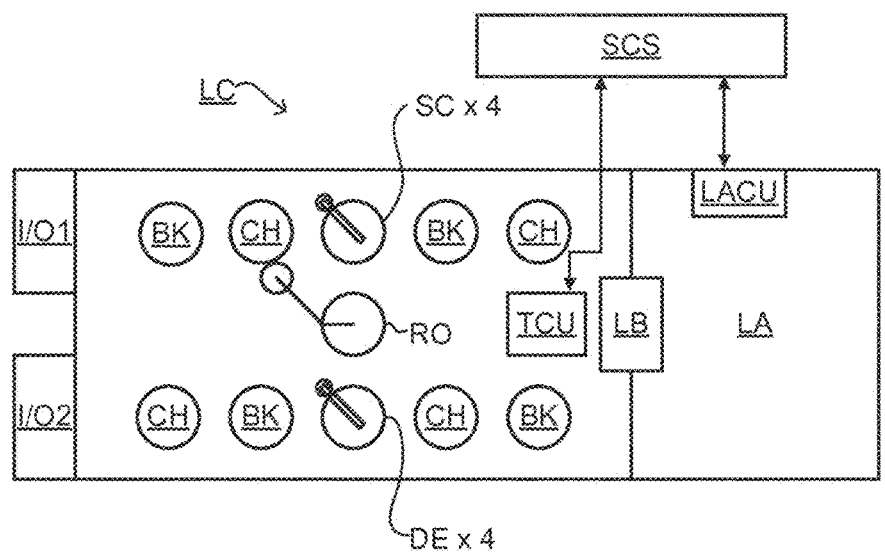
FIG. 2 depicts a lithographic cell or cluster.

As shown in FIG. 2 the lithographic apparatus LA forms part of a lithographic cell LC, also sometimes referred to a lithocell or cluster, which also includes apparatus to perform pre- and post-exposure processes on a substrate. Conventionally these include one or more spin coaters SC to deposit resist layers, one or more developers DE to develop exposed resist, one or more chill plates CH and/or one or more bake plates BK. A substrate handler, or robot, RO picks up substrates from input/output ports I/O1, I/O2, moves them between the different process apparatuses and delivers then to the loading bay LB of the lithographic apparatus. These devices, which are often collectively referred to as the track, are under the control of a track control unit TCU that is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure values of one or more properties such as overlay errors between subsequent layers, line thicknesses, critical dimensions (CD), etc. If errors are detected, adjustments, for example, can be made to exposures of subsequent substrates, especially if the inspection can be done soon and fast enough that other substrates of the same batch are still to be exposed. Also, already exposed substrates may be stripped and reworked to improve yield, or possibly be discarded, thereby avoiding performing exposures on substrates that are known to be faulty. In a case where only some target portions of a substrate are faulty, further exposures can be performed only on those target portions that are deemed to be non-faulty.

A metrology apparatus is used to determine the values or one or more properties of the substrates, and in particular, how the values of one or more properties of different substrates or different layers of the same substrate vary from layer to layer. The metrology apparatus may be integrated into the lithographic apparatus LA or the lithocell LC or may be a stand-alone device. To enable most rapid measurements, it is desirable that the metrology apparatus measure one or more properties in the exposed resist layer immediately after the exposure. However, the latent image in the resist has a very low contrast, as in there is only a very small difference in refractive index between the parts of the resist which have been exposed to radiation and those which have not—and not all metrology apparatus have sufficient sensitivity to make useful measurements of the latent image. Therefore measurements may be taken after the post-exposure bake step (PEB) that is customarily the first step carried out on exposed substrates and increases the contrast between exposed and unexposed parts of the resist. At this stage, the image in the resist may be referred to as semi-latent. It is also possible to make measurements of the developed resist image, at which point either the exposed or unexposed parts of the resist have been removed, or after a pattern transfer step such as etching. The latter possibility limits the possibilities for rework of faulty substrates but may still provide useful information.

An example metrology apparatus is schematically shown in FIG. 3a. A target T and diffracted rays of measurement radiation used to illuminate the target are illustrated in more detail in FIG. 3b. The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by source 11 (e.g., a xenon lamp) is directed onto substrate W via an optical element 15 by an optical system comprising lenses 12, 14 and objective lens 16. These lenses are arranged in a double sequence of a 4F arrangement. A different lens arrangement can be used, provided that it still provides a substrate image to a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the examples of FIG. 3 forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. The rest of the pupil plane is desirably dark as any unnecessary radiation outside the desired illumination mode will interfere with the desired measurement signals. In other embodiments, as discussed below with reference to FIGS. 4-8, aperture plates 13 of different form may be used, such as the aperture plate labeled 13H.

As shown in FIG. 3b, target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 3a and 3b are shown somewhat off axis, purely to enable them to be more easily distinguished in the diagram.

In the example of FIG. 3 at least the 0 and +1 orders diffracted by the target T on substrate W are collected by objective lens 16 and directed back through optical element 15. Returning to FIG. 3*a*, both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment, on-axis illumination of the targets is used and an aperture stop with an off-axis aperture is used to pass substantially only one first order of diffracted radiation to the sensor. In yet other embodiments, $2^{nd}$, $3^{rd}$ and higher order beams (not shown in FIG. 3) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can be used to measure gratings oriented in one direction (X or Y depending on the set-up). For measurement of an orthogonal grating, rotation of the target through 90° and 270° might be implemented.

FIG. 3*c* depicts an example of a (composite) target formed on a substrate. The target in this example comprises four gratings or periodic structures 25*a* to 25*d* positioned closely together so that they will all be within a measurement scene or measurement spot 24 formed by the metrology radiation illumination beam of the metrology apparatus. The four gratings or periodic structures thus are all simultaneously illuminated and simultaneously imaged on sensors 19 and 23. In an example dedicated to measurement of overlay, structures 25*a* to 25*d* are themselves composite periodic structures formed by overlying gratings that are patterned in different layers of the semiconductor device formed on substrate W. Structures 25*a* to 25*d* may have differently biased overlay offsets (deliberate mismatch between layers) in order to facilitate measurement of overlay between the layers in which the different parts of the composite gratings are formed. Such techniques are well known to the skilled person and will not be described further. Structures 25*a* to 25*d* may also differ in their orientation, as shown, so as to diffract incoming radiation in X and Y directions. In one example, structures 25*a* and 25*c* are X-direction gratings with biases of the +d, −d, respectively. Structures 25*b* and 25*d* are Y-direction gratings with offsets +d and −d respectively. Separate images of these gratings can be identified in the image captured by sensor 23. This is only one example of a target. A target may comprise more or fewer than four gratings, or only a single grating.

FIG. 3*d* shows an example of an image that may be formed on and detected by the sensor 23, using the target of FIG. 3*c* in the apparatus of FIG. 3*a*. While the pupil plane image sensor 19 cannot resolve the different individual structures 25*a* to 25*d*, the image sensor 23 can do so. The dark rectangle represents the field of the image on the sensor, within which the illuminated spot 24 on the substrate is imaged into a corresponding circular area 26. Within this, rectangular areas 27*a* to 27*d* represent the images of the small target structures 25*a* to 25*d*. If the targets are located in product areas, product features may also be visible in the periphery of this image field. Image processor and controller PU processes these images using pattern recognition to identify the separate images 27*a* to 27*d* of structures 25*a* to 25*d*. In this way, the images do not have to be aligned very precisely at a specific location within the sensor frame, which greatly improves throughput of the measuring apparatus as a whole.

Once the separate images of the periodic structures or gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

As mentioned in the introductory part of the description, measurements of overlay and other asymmetries in target structures is difficult when structures are at the resolution of device features to be manufactured. This is because it is difficult to capture higher than zeroth order diffracted radiation. In an arrangement of the type depicted in FIGS. 3*a*-3*d* for example, the angles of either or both of the +1 and −1 diffracted orders become too high for both to be captured by the objective lens 16 or these orders become evanescent (non-propagating).

Target asymmetry makes a contribution, albeit extremely small, to zeroth order reflected beams (i.e. specular reflected beams). Zeroth order reflected beams are relatively easily captured by the objective lens 16. Interferometry can be used to measure the asymmetry contribution to the zeroth order reflected beams with high sensitivity, as well as other parameters of interest. Embodiments based on this principle are described below.

According to an embodiment, a metrology apparatus configured to measure a structure formed on a substrate by a lithographic process is provided. In an embodiment, the metrology apparatus is broadly similar to the metrology apparatus of FIG. 3 in the case where only the first measurement branch (in which a detector is placed in a pupil plane) is provided. It is not however necessary for the detection to take place in the pupil plane. In other embodiments the detector is placed in the image plane or in a plane between the image plane and the pupil plane. The metrology apparatus comprises an optical system (described below with reference to FIGS. 4 and 5) that focuses radiation onto the structure and directs radiation after redirection by the structure to a detection system 102 (via arrow 100). Further details about example detection systems 102 are given below with reference to FIGS. 13-17. The optical system is configured such that the detection system 102 detects a radiation intensity resulting from interference between radiation from at least two different points in a pupil plane field distribution. The interference is such that a component of the detected radiation intensity containing information about a parameter of interest is enhanced relative to one or more other components of the detected radiation intensity (due to at least partially destructive interference of radiation corresponding to the one or more other components). The optical system may introduce the required spatial coherence between different points in the pupil plane field distribution, so the functionality can be implemented using an incoherent radiation source. In an embodiment, the detected radiation intensity results from zeroth order reflection from the structure. The approach is therefore suitable for measuring high resolution features (e.g. features at the resolution of device structures to be manufactured).

The embodiments discussed with reference to FIGS. 4-7, 13, 14 and 16 implement the above functionality using a form of common path interferometry, in which radiation that is split by a beam splitter follows a common path in different senses before being interfered after passing through the beam splitter a second time. The parameter of interest in these embodiments is overlay, but the principle could be applied to one or more other parameters of interest.

Figure 4:
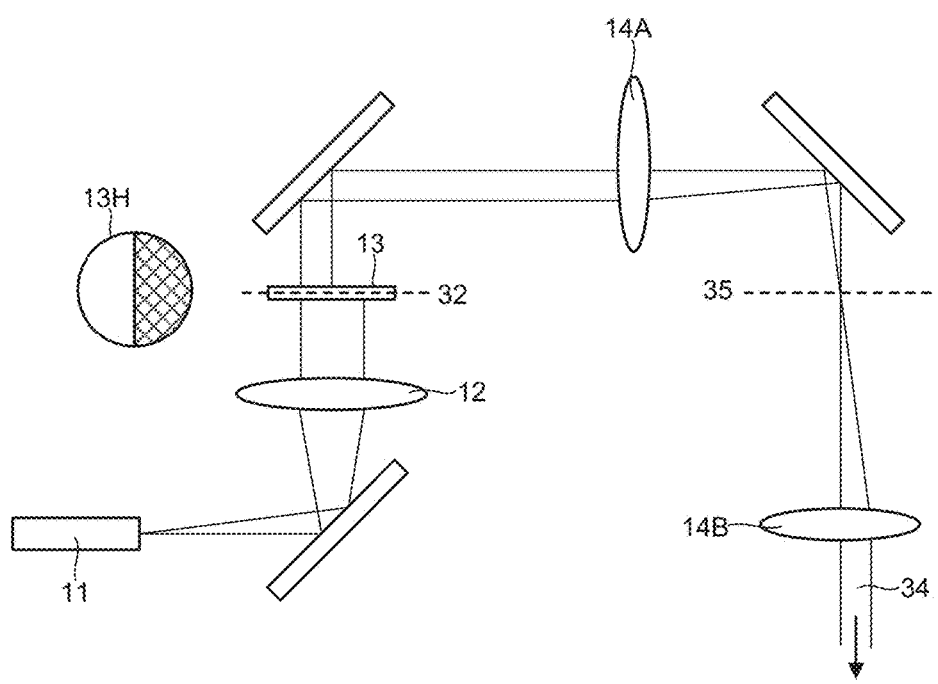
FIG. 4 schematically depicts optical elements of a metrology apparatus that provides an input radiation beam to an optical unit comprising a beam splitter.
Figure 5:
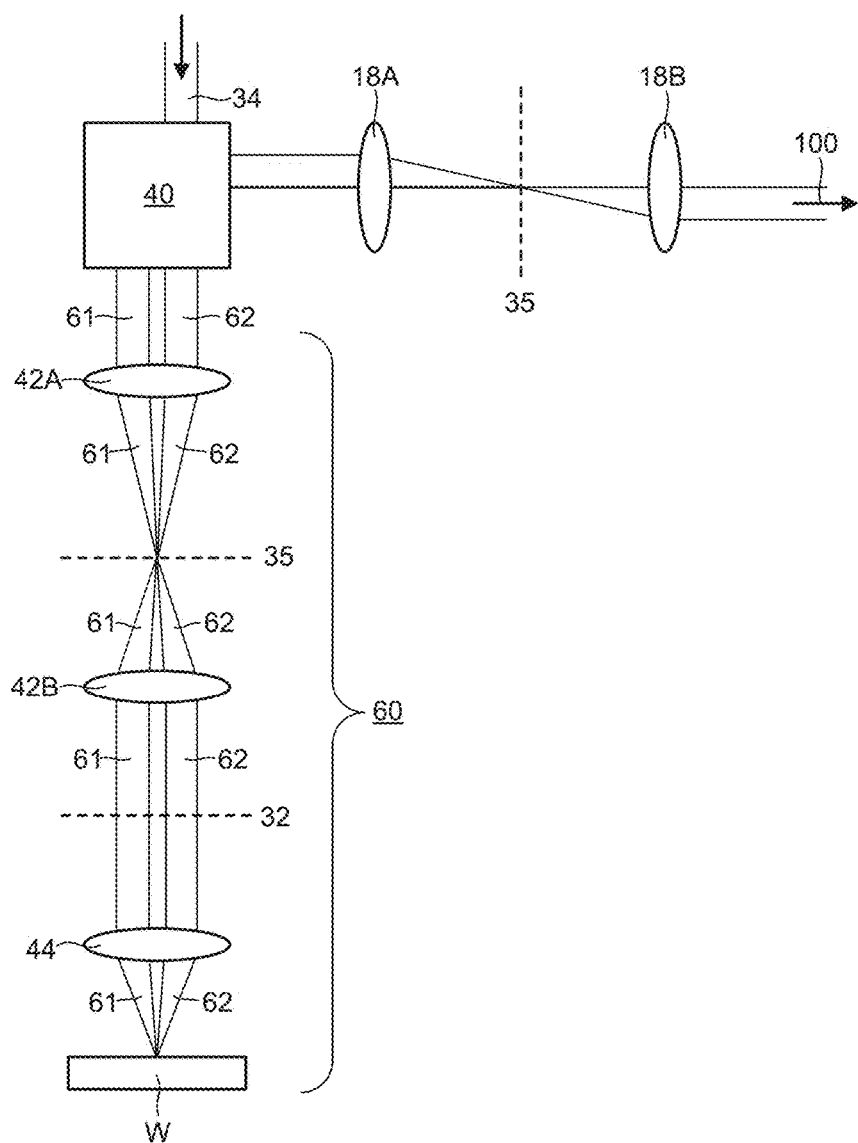
FIG. 5 schematically depicts the optical unit configured to receive the input radiation beam from the arrangement of FIG. 4 and an optical system configured to direct first and second radiation beams onto a substrate and direct redirected first and second radiation beams from the substrate onto a detector.
Figure 6:
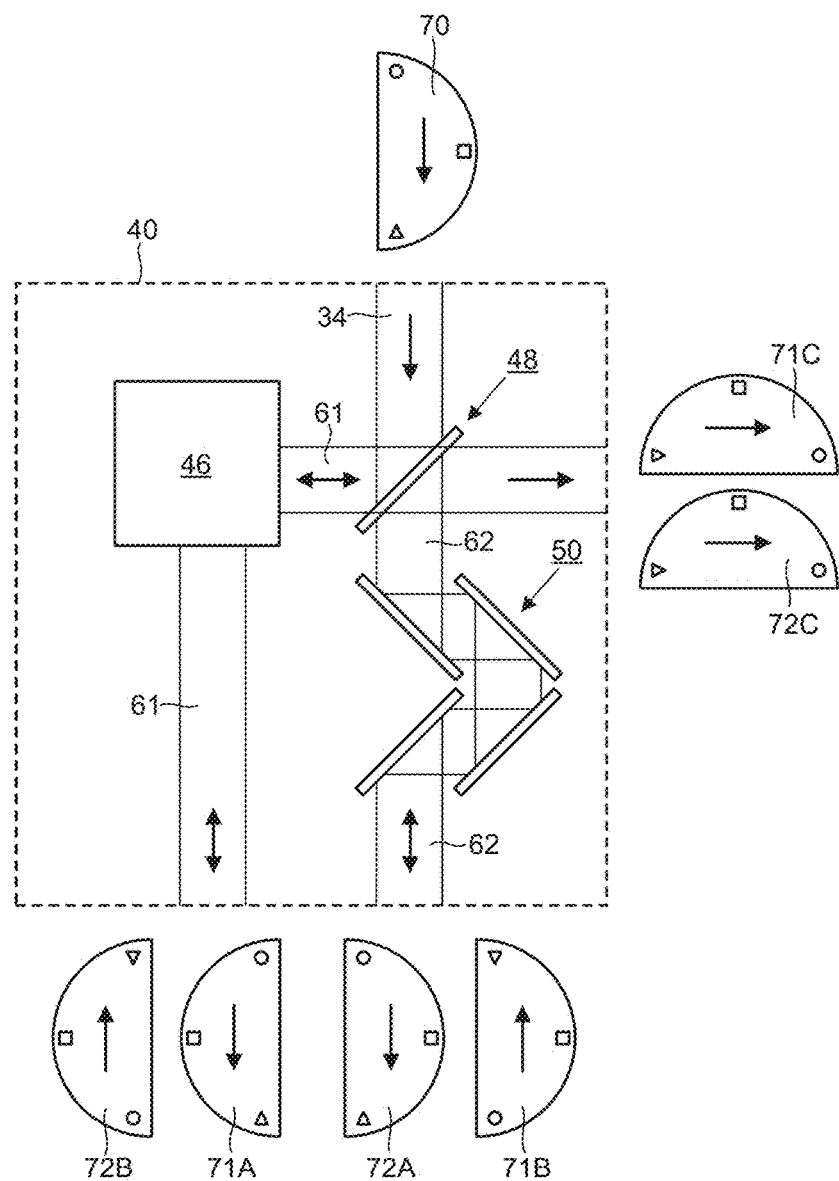
FIG. 6 schematically depicts operation of an optical unit of the arrangement of FIG. 5 in further detail, showing pupil plane field distributions of radiation beams propagating to and from the beam splitter.
Figure 7:
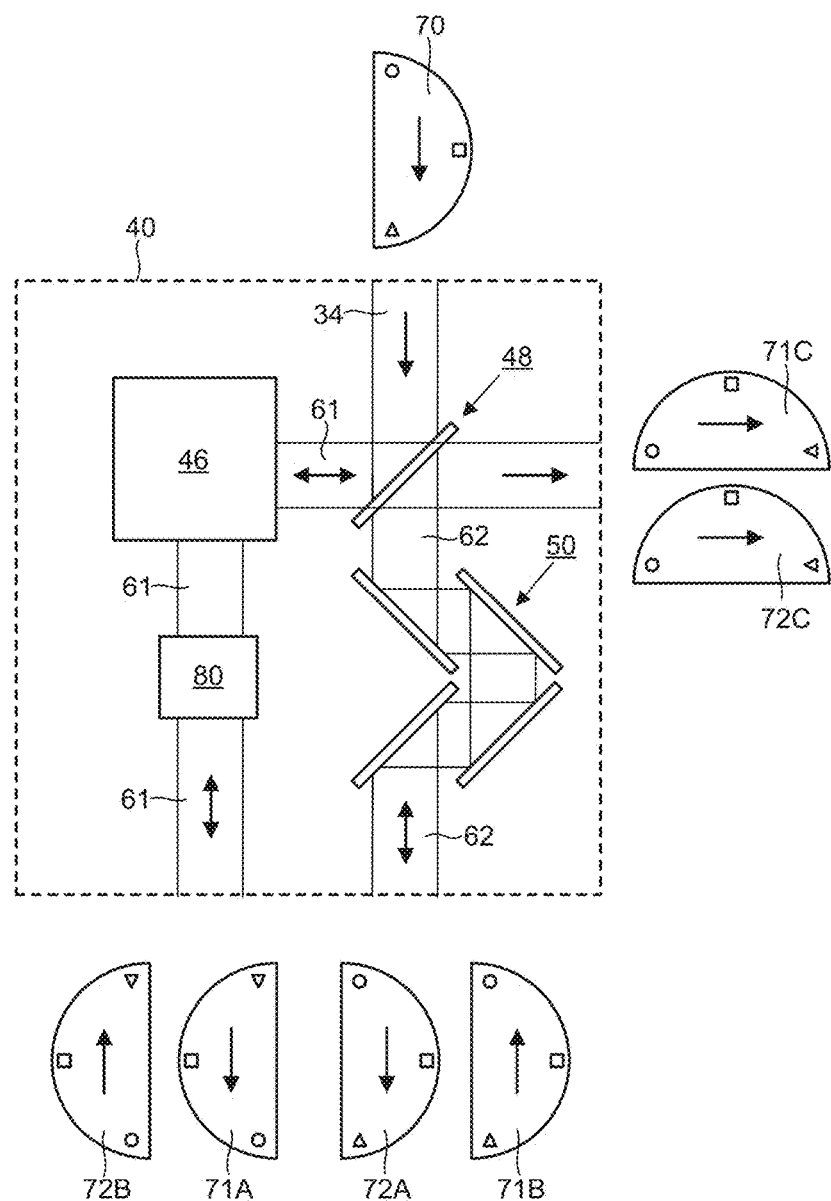
FIG. 7 schematically depicts operation of a further optical unit based on the optical unit of FIG. 6 with an additional flip being performed in the first branch.

FIG. 4 depicts optical elements of an example metrology apparatus configured to provide an input radiation beam 34 to an optical unit 40 (shown in FIGS. 5-7). A source 11 (e.g. an output end of an optical fiber) provides a radiation beam that is passed through a lens system comprising lenses 12, 14A and 14B. The lenses 12, 14A and 14B correspond to lenses 12 and 14 shown in FIG. 3. Like the lenses 12 and 14 of FIG. 3, the lenses 12, 14A and 14B may be arranged in a double sequence of a 4F arrangement. A pupil plane in which a pupil plane field distribution is formed and is labeled 32. An image plane in which an image of the source (e.g. the end of the optical fiber) is formed is labeled 35. An aperture plate 13 is provided in a pupil plane 32. The aperture plate 13 may take the form depicted by aperture plate 13H for example (viewed from above). The aperture plate 13 imparts a desired pupil plane field distribution to the input radiation 34 provided to a beam splitter 48 and will be described in further detail below. The input radiation 34 may optionally be polarized by a polarizer (e.g. linearly polarized).

As depicted in FIGS. 6, 7, 13 and 14, in embodiments the optical unit 40 comprises a beam splitter 48. The beam splitter 48 splits the input radiation beam 34 into a first radiation beam and a second radiation beam. The optical unit 40 is part of an optical system (depicted in FIG. 5) that directs the first radiation beam and the second radiation beam onto a substrate W and directs redirected radiation from the substrate W to a detection system 102 (which may comprise one or more CCD or CMOS sensors for example) via the beam splitter 48 (via arrow 100). The detection system 102 may detect in a pupil plane. The detection system 102 may thus record an intensity in a pupil plane field distribution of a combination of the first radiation beam and the second radiation beam after redirection by the substrate W. As will be described in further detail below, the detection system 102 detects radiation resulting from interference between the first radiation beam and the second radiation beam. In an embodiment the interference is such that the first radiation beam and the second radiation beam interfere more destructively (e.g. completely destructively) at the point of detection for reflections from a symmetric component of a target structure than for reflections from an asymmetric component of the target structure. A background signal that does not contain information about asymmetry in a target structure is thereby removed or reduced. A portion of the signal that does contain information about the asymmetry in the target structure is retained. The sensitivity with which the asymmetry can be measured is thereby increased. The interference between the first radiation beam and the second radiation beam comprises interference between different points in a pupil plane field distribution. In these embodiments, pairs of points in the pupil plane field distribution that are to interfere with each other are arranged symmetrically about a common point (for point symmetry) or common axis (for mirror symmetry) of symmetry. When the pupil plane field distribution is perfectly symmetric about the common point or axis of symmetry the pairs of points have the same amplitude and can be made to interfere destructively by applying a 180 degrees phase shift between them. A symmetric background signal can thus be removed efficiently and any deviation from symmetry can be detected with high sensitivity. FIG. 6 described below depicts an example in which different points in the pupil plane field distribution are interfered mirror symmetrically. FIG. 7 described below depicts an example in which different points in the pupil plane field distribution are interfered point symmetrically.

In an embodiment, reflected first radiation beam and reflected second radiation beam reaching the detector result from zeroth order reflection from a target structure on the substrate W. The approach is therefore suitable for measuring high resolution features (e.g. features at the resolution of device structures to be manufactured).

In the embodiment of FIGS. 4-7, 13, 14 and 16, an optical system 60 is such that the first radiation beam and the second radiation beam propagate in opposite directions around a common optical path comprising a first branch 61 and a second branch 62. In the embodiment shown, the first branch 61 and the second branch 62 have optical elements in common (e.g. lenses 42A, 42B and 44) although the radiation propagates through different portions of these common optical elements in each branch. The common optical path is common in the sense that the optical trajectory of the first radiation beam and the optical trajectory of the second radiation beam can be superimposed onto each other (within engineering tolerances). The only difference between the optical trajectories of the first radiation beam and the second radiation beam in the common optical path is that the first radiation beam and second radiation beam travel in opposite directions. The common optical path is a closed optical path. The first radiation beam propagates from the beam splitter 48 to the substrate W along the first branch 61 (downwards in the examples shown) and from the substrate W back to the beam splitter 48 along the second branch 62 (upwards in the examples shown). The second radiation beam propagates from the beam splitter 48 to the substrate W along the second branch 62 (downwards in the examples shown) and from the substrate W back to the beam splitter 48 along the first branch 61 (upwards in the examples shown). The first radiation beam and the second radiation beam are focused onto the same location on the substrate, forming an image on the substrate W (e.g. an image of the source 11). A phase shift is applied to the first radiation beam relative to the second radiation beam to increase destructive interference between the first radiation beam and the second radiation beam at the detector 38 (relative to the case where no phase shift is applied). In an embodiment the phase shift is applied uniformly to the whole of the cross-section of the first radiation beam relative to the whole of the cross-section of the second radiation beam. In one particular class of embodiments, the phase shift is equal to 180 degrees. The phase shift is such as to cause the component of the detected radiation intensity containing information about the parameter of interest (e.g. overlay) to be enhanced by interference relative to the one or more other components of the detected radiation intensity.

Due to the common optical path of the first radiation beam and the second radiation beam, if the target structure from which the first radiation beam and the second radiation beam is redirected is fully symmetric (e.g. point symmetric or mirror symmetric), complete destructive interference can be achieved at the detection system 102 for all points in the pupil plane field distribution, in the case of an applied phase difference of 180 degrees. Any asymmetry in the target structure, due to overlay for example, will cause incomplete destructive interference. The incomplete destructive interference provides a signal at the detection system 102 that can be used to obtain a measure of the asymmetry. The interferometry thus removes unwanted background signal and improves a sensitivity with which the asymmetry can be measured.

The extent to which background signal can be removed will depend on alignment accuracy of optical elements such as the beam splitter 48 and/or optical imperfections. Imperfect alignment will lead to fringes (due to reflected beams from the first radiation beam and the second radiation beam not lying exactly on top of each other or not propagating in exactly the same direction). Imperfect optics will lead to incomplete background suppression, for example if the beam splitter 48 does not provide exactly 50/50 beam splitting.

In the example of FIG. 5, the first radiation beam and the second radiation beam are both focused onto the substrate W by lenses 42A, 42B and 44. An image plane between lenses 42A and 42B is labeled 35. The substrate W is also positioned in an image plane. A pupil plane between lenses 42B and 44 is labelled 32. Reflected radiation from the first radiation beam and the second radiation beam is directed to the detector 38 (see, e.g., FIG. 9), after passing a second time through the beam splitter 48, via lenses 18A and 18B. An image plane between lenses 18A and 18B is labeled 35.

In an embodiment, the first radiation beam and the second radiation beam are directed onto the substrate W symmetrically. The symmetry may result in a pupil plane field distribution of the first radiation beam being mirror symmetric or point symmetric with respect to a pupil plane field distribution of the second radiation beam (which is in the same plane as the pupil plane field distribution of the first radiation beam) prior to redirection of the first radiation beam and the second radiation beam from the substrate W. The optical system performs at least one flip or rotation of the pupil plane field distribution of radiation propagating in the first branch or the second branch such that the image from the first radiation beam and the image from the second radiation beam are respectively formed by radiation having pupil plane field distributions that are mirror symmetric or point symmetric with respect to each other.

In the example of FIG. 6 the pupil plane field distribution of radiation propagating in the first branch is flipped (re-flected) such that the image from the first radiation beam and the image from the second radiation beam are respectively formed by radiation having pupil plane field distributions that are mirror symmetric with respect to each other. In embodiments of this type an optical path length compensator 50 may be provided to compensate for the additional optical path length introduced by the flipping of the pupil plane field distribution. In the particular example of FIG. 6, the pupil plane is flipped by pupil plane field distribution modifying unit 46 in the first branch 61. The optical path length compensator 50 is then positioned in the second branch 62.

The pupil plane field distribution modification unit 46 may be implemented in various ways. In the configuration shown, any combination of optical elements that achieves the desired function of changing the direction of the radiation beam (from horizontal to down) and flipping the pupil plane field distribution may be used. The functionality can be implemented using two suitably oriented mirrors or a pentaprism for example.

The optical path length compensator 50 may be implemented in various ways. Any combination of optical elements that achieves the desired function of making the optical path length from beam splitter 48 to the target structure on the substrate W the same for the first radiation beam and the second radiation beam (by compensating for the detour through the pupil plane field distribution modification unit 46) may be used. This is used to help ensure that the target structure is in the image plane and therefore in focus (allowing optimal measurement of the target structure). In the particular example of FIG. 6, the optical path length compensator 50 comprises four mirrors. The optical path length compensator 50 could alternatively be implemented using right angle prisms, or a combination of right angle prisms and mirrors. The optical path length compensator 50 can be fixed (e.g. perfectly matched to the pupil plane field distribution modification unit 46) or tunable in length (for flexibility). In principle, a plate of glass could be used (because of the high index of refraction).

FIG. 7 depicts an implementation of symmetrically directing the first radiation beam and the second radiation beam onto the substrate W. In contrast to the embodiment of FIG. 6 in which mirror symmetry is achieved, the arrangement of FIG. 7 results in the pupil plane field distribution of the first radiation beam being point symmetric with respect to the pupil plane field distribution of the second radiation beam prior to redirection of the first radiation beam and the second radiation beam by the substrate W. In the example of FIG. 7 this is achieved by modifying the arrangement of FIG. 6 to add an additional flip (mirror reflection) in the first branch 61. In the example shown, the additional flip is implemented by a dove prism 80. In an alternative embodiment, the additional flip is implemented using a roof top Amici prism, for example in place of one of the mirrors of the optical path length compensator 50. Alternatively, the additional flip is provided in the second branch 62. Alternatively, the effect can be achieved by rotation of the pupil plane field distributions, for example by implementing −90 degrees rotation in one of the branches and a +90 degrees rotation in the other branch. Point symmetry is desirable because it corresponds to interfering radiation beams that have interacted with the target from opposite directions. This may not be necessary for aligned grating targets where the symmetry of the targets themselves means that mirror symmetry in the pupil plane field distributions may be adequate. When the overlay target is not aligned, however, or when it is desired to measure product features, it may be necessary to use an embodiment such as that of FIG. 7 to help ensure that the pupil plane field distributions are point symmetric.

The beam splitter 48 can be implemented in various ways. In the example shown a plate beam splitter is used. In other embodiments, a cube beam splitter or a pellicle beam splitter is used. For maximum destructive interference, a 50/50 beam splitter is desirable.

When measuring asymmetry only, such as overlay only, a phase shift of 180 degrees may be used. However, using another phase shift will mean incomplete suppression of the background signal. This may be beneficial where it is desired to obtain information from the background signal. Information about symmetrical properties of the target (e.g. critical dimension) may be obtained for example. In an embodiment, the metrology apparatus is configured so that the phase shift is selectively controllable. The level of background signal can therefore be tuned as desired or the measurement can be switched between a mode that is sensitive predominantly to asymmetric properties and a mode that is sensitive predominantly to symmetric properties. In an embodiment, the phase shift is arranged at least temporarily to be close to 180 degrees but not exactly 180 degrees (e.g. 180 degrees plus or minus a shift of 1 or more degrees, plus or minus 2 or more degrees, plus or minus 5 or more degrees, plus or minus 10 or more degrees, or plus or minus 20 or more degrees). Control of the phase shift may be implemented by suitable adaptation of the beam splitter 48 for example.

Alternatively or additionally, measurement of symmetric properties may be achieved by providing an apparatus to selectively remove the beam splitter 48 or to selectively replace the beam splitter 48 with a different component, such as a two sided mirror. Alternatively or additionally, the beam splitter 48 may be configured to have a beam splitting ratio other than 50/50 (which will result in incomplete destructive interference with respect to symmetric components of the target structure).

In the embodiments of FIGS. 6 and 7, a phase shift of 180 degrees between the reflected first radiation beam and the reflected second radiation beam is provided by the different ways the two beams are reflected or transmitted through the beam splitter. In the particular example shown the first radiation beam is output by reflection from one side (the left side) of the beam splitter 48 and is directed to the detector 38, after propagation around the common optical path, by reflection from the opposite side (the right side) of the beam splitter 48. This involves two reflections (one internal and one external). The second radiation beam, in contrast, is output by transmission through the beam splitter 48 and is directed to the detector 38, after propagation around the common optical path, by transmission through the beam splitter 48 a second time. Thus, if the optical path lengths are the same, the 180 degree phase shift introduced by the one external reflection from beam splitter provides the desired 180 degrees phase shift between the two radiation beams.

In an embodiment, the input radiation 34 to the beam splitter 48 comprises a pupil plane field distribution in which a first region of the pupil plane field distribution has been removed to leave only a second region of the pupil plane field distribution. In the embodiment of FIGS. 4-7, 13, 14 and 16, the first region is removed by aperture plate 13H. In an embodiment, the first region and the second region are oppositely oriented semicircles. This approach is desirable because it allows a maximum proportion of the radiation to contribute to the symmetrical illumination of the substrate W. A full circular pupil plane field distribution is provided at lens 44. One half is provided by the first radiation beam and the other half is provided by the second radiation beam. In an embodiment of this type, the flipping of the pupil plane field distribution may comprise a reflection about the straight edge of the semicircle of the first region of the pupil plane (FIG. 6) and/or a reflection about a line of mirror symmetry of the semicircle of the first region of the pupil plane (FIG. 7).

FIG. 6 depicts the pupil plane field distributions at various points in the optical path between the input of the input radiation 34 to the optical unit 40 and the output from the optical unit 40 of the radiation beams after redirection by the substrate W. The pupil plane field distribution of the input radiation 34 at the point of entry into the optical unit 40 is labelled 70 (as viewed from above). The arrow indicates the direction of propagation of the radiation (downwards in this case). The circle, square and triangle are provided in the figure (they are not present in the actual pupil plane field distributions) to identify reference parts of the pupil plane field distribution in order to facilitate visual tracking of the orientation of the pupil plane field distribution through the optical system in the Figure.

As described above, the input radiation 34 is split by the beam splitter into a first radiation beam and a second radiation beam.

The first radiation beam follows the first branch 61 and passes through the pupil plane field distribution modification unit 46 before exiting the optical unit 40 downwards. The pupil plane field distribution at this stage (as viewed from above) is labelled 71A. As can be seen, pupil plane field distribution 71A is a mirror image of pupil plane field distribution 70. The axis of mirror symmetry is the straight edge of the semicircle. The first radiation beam passes through optics between the optical unit 40 and the substrate W (the rest of the first branch 61) to form an image on the substrate W. The first radiation beam is then redirected by the substrate W and propagates upwards along the second branch 62. The redirected first radiation beam passes through the optics between the substrate W and the optical unit 40. The pupil plane field distribution of the redirected first radiation beam on entry to the optical unit is labelled 71B (viewed from above). The optics between the optical unit 40 and the substrate W leads to rearrangement of the pupil plane field distribution 71A in a point symmetric way to provide the pupil plane field distribution 71B. The redirected first radiation beam passes through the optical path length compensator 50 upwards and is output from the optical unit 40 after reflection from the beam splitter 48. The pupil plane field distribution at this stage (viewed horizontally from the left) is labeled 71C.

The second radiation beam propagates around the common optical path in the opposite sense to the first radiation beam. The pupil plane field distribution of the second radiation beam after transmission through the beam splitter 48 and propagation through the optical path length compensator 50 is labelled 72A (viewed from above). Pupil plane field distribution 72A is essentially identical to pupil plane field distribution 70. The second radiation beam passes through optics between the optical unit 40 and the substrate W (the rest of the second branch 62) to form an image on the substrate W. The second radiation beam is then redirected by the substrate W and propagates upwards along the first branch 61. The redirected second radiation beam passes through the optics between the substrate W and the optical unit 40. The pupil plane field distribution of the redirected second radiation beam on entry to the optical unit 40 is labelled 72B (viewed from above). The optics between the optical unit 40 and the substrate W leads to rearrangement of the pupil plane field distribution 72A in a point symmetric way to provide the pupil plane field distribution 72B. The redirected second radiation beam passes through the pupil plane field distribution modification unit 46 and is output from the optical unit 40 after transmission through the beam splitter 48 a second time. The pupil plane field distribution at this stage (viewed horizontally from the left) is labeled 72C.

FIG. 7 depicts the pupil plane field distribution at the same points as FIG. 6. The additional flip discussed above causes the pupil plane field distribution 71A to be point symmetric with respect to the pupil plane field distribution 72A instead of mirror symmetric.

Pupil plane field distributions 71C and 72C have the same orientation and lie exactly over each other (within engineering tolerances). This causes radiation originating from pairs of points that are mirror symmetric or point symmetric with respect to each other in the pupil plane field distribution defined by the combination of distributions 71B and 72B in FIGS. 6 and 7 to interfere. Corresponding radiation intensities can then be detected at the detection system 102. In the schematic illustrations of FIGS. 6 and 7, the two triangles of distributions 71B and 72B will interfere, the two squares of distributions 71B and 72B will interfere, and the two circles of distributions 71B and 72B will interfere. If the pupil plane field distributions 71B and 72B are exactly the same as each other (because the target structure has not induced any asymmetry), destructive interference will cause the whole pupil plane field distribution to be dark. Because two copies of the half pupil are spatially overlapped it is not necessary to have spatial coherence throughout the pupil. As discussed above, any asymmetry in the pupil plane field distribution will cause incomplete destructive interference and thereby provide bright regions. The bright regions can be detected by the detection system 102 and provide information about asymmetry in the target structure.

In a further embodiment, a metrology apparatus is provided which uses an optical pupil symmetrization (OPS) system to provide the destructive interference for the reflections from symmetric components of the target structure and the constructive interference for the reflections from asymmetric components of the target structure (such as overlay). Details of how to implement an OPS system are provided in PCT Patent Application Publication No. WO 2016/096310, which is hereby incorporated in its entirety by reference.

Figure 8:
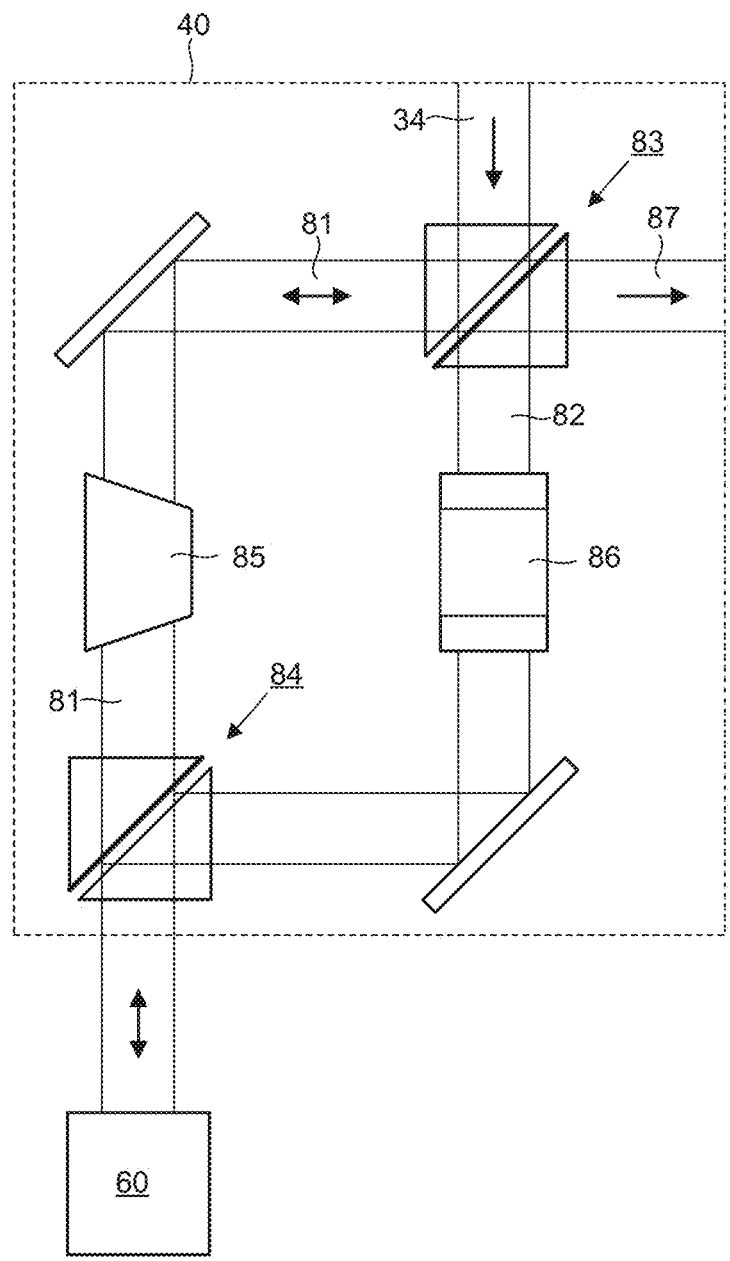
FIG. 8 schematically depicts a further optical unit in which radiation passes through first and second beam splitters before and after redirection by the target structure.

In an embodiment, a metrology apparatus as described above with reference to FIGS. 4 and 5 is provided, except that the configuration of FIG. 4 may not comprise the aperture plate 13H to remove the first region of the pupil field distribution and the optical unit 40 is configured as shown in FIG. 8. The optical unit 40 of FIG. 8 comprises an OPS system. The optical unit 40 comprises a first beam splitter 83 that splits the radiation beam 34 into a first radiation beam and a second radiation beam. The optical unit 40 further comprises a second beam splitter 84 that recombines the first radiation beam and the second radiation beam. The first radiation beam propagates along a first optical branch 81 between the first beam splitter 83 and the second beam splitter 84. The second radiation beam propagates along a second optical branch 82 between the first beam splitter 83 and the second beam splitter 84. The first optical branch 81 and the second optical branch 82 flip or rotate a field distribution of the first radiation beam relative to a field distribution of the second radiation beam about two orthogonal axes. In the example of FIG. 8, the first radiation beam is flipped about a first axis in the first branch 81 using a first dove prism 85. The second radiation beam is flipped about a second axis, perpendicular to the first axis, in the second branch 82 using a second dove prism 86. In an alternative implementation, optical elements are provided that rotate the first radiation beam by −90 degrees in the first branch and rotate the second radiation beam by +90 degrees in the second branch. The optical path length along the first optical branch 81 is essentially equal to the optical path length along the second optical branch 82.

The radiation beam passes through the first beam splitter 83 and the second beam splitter 84 before being redirected by the target structure (via optical system 60, which may be configured for example as shown in FIG. 5). The pupil plane field distribution of the radiation beam that is focused onto the structure is point symmetric. The radiation beam then additionally passes through the first beam splitter 83 and the second beam splitter 84 after redirection by the target structure (in the opposite direction). This results in a first output 87 from the first beam splitter 83 being formed by the first radiation beam and the second radiation beam interfering destructively for reflections from a symmetric component of the target structure and interfering constructively for reflections from an asymmetric component of the target structure. The first output 87 is therefore such that a component of the detected radiation intensity containing information about the parameter of interest (e.g. overlay) is enhanced relative to one or more other components (e.g. symmetric components).

Radiation can propagate through the OPS system of FIG. 8 via four different routes: 1) to the target structure via the first optical branch 81 and back to the first beam splitter 83 via the second optical branch 82, 2) to the target structure via the second optical branch 82 and back to the first beam splitter 83 via the first optical branch 81, 3) to the target structure via the first optical branch 81 and back to the first beam splitter 83 via the first optical branch 81, and 4) to the target structure via the second optical branch 82 and back to the first beam splitter 83 via the second optical branch 82. Routes 1 and 2 considered together are similar to the common path interferometric embodiments discussed with reference to FIGS. 4-7. Routes 3 and 4 considered together resemble a double Mach Zehnder interferometer. Both pairs of routes provide a phase difference of 180 degrees in respect of reflection from symmetric components of the target structure, thereby leading to destructive interference. Asymmetric components may interfere constructively and thereby contribute to the detected signal via the first output 87.

Figure 9:
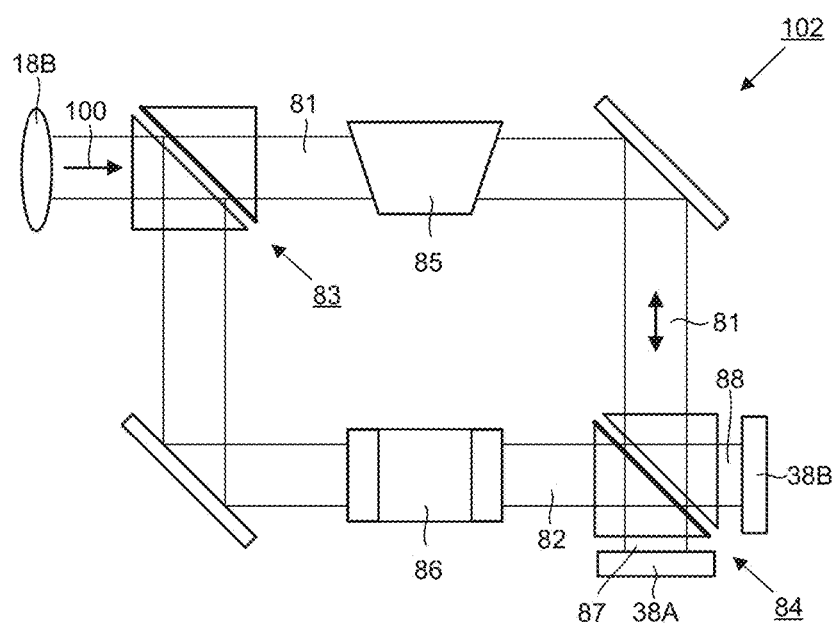
FIG. 9 schematically depicts an optical arrangement in which radiation passes through first and second beam splitters only after redirection by the target structure.

FIG. 9 depicts an embodiment in which the OPS system of FIG. 8 is positioned so that the radiation beam passes through only after redirection by the target structure (and not before). In embodiments of this type other arrangements may be provided to introduce spatial coherence in radiation incident on the structure and/or the source 11 may be configured to output spatially coherent radiation. The metrology apparatus in this case may be as described above with reference to FIGS. 4 and 5, except that the configuration of FIG. 4 may not comprise the aperture plate 13H to remove the first region of the pupil field distribution, the optical unit 40 in FIG. 5 has a single beam splitter, and the OPS system of FIG. 9 is provided after the lens 18B shown in FIG. 5. In this embodiment, a first detector 38A detects radiation output from a first output 87 of the second beam splitter 84. A second detector 38B detects radiation output from a second output 88 of the second beam splitter 84. The OPS system in this case operates according to the principles of a Mach Zehnder interferometer. When the path lengths are equal in the first optical branch 81 and the second optical branch 82 from the beam splitter 83, the first output 87 will be dark due to destructive interference and the second output 88 will be bright due to constructive interference. As in the embodiment of FIG. 8, dove prisms 85 and 86 flip the field distributions of the first radiation beam and the second radiation so that the two copies of the pupil are point symmetric when they are interfered. In the first detector 38A, the radiation is interfered destructively and only the asymmetry signal (from reflection from asymmetric components of the target structure) remains. This causes a component of the detected radiation intensity containing information about a parameter of interest (e.g. overlay) to be enhanced relative to other components. In the second detector 38B, the radiation is interfered constructively. This allows the second detector 38B to detect a radiation intensity in which the component containing information about a parameter of interest (e.g. overlay) is suppressed relative to other components. The second detector 38B can thus be used to measure the symmetric part of the pupil for example.

If the interferometric systems described above with reference to FIGS. 6-9 are perfectly balanced, measured radiation intensity approximately follows a cosine curve as a function of target asymmetry (e.g. overlay). The symmetry of the cosine curve means the sign of the detected asymmetry is ambiguous if only a single value of intensity is obtained. A given magnitude of asymmetry with a first sign (e.g. overlay in a +X direction) will give rise to the same intensity as the same magnitude of asymmetry with the opposite sign (e.g. overlay in a −X direction). One approach for dealing with this issue is to use metrology targets with non-zero nominal asymmetry, e.g. metrology targets having an overlay bias. This approach involves special metrology targets and is relatively inflexible and limited in terms of how much extra information is provided. Approaches that provide increased flexibility by applying offsets in optical characteristics of radiation are described below.

In an embodiment, the optical system is configured to apply a plurality of different offsets of an optical characteristic to radiation before and/or after redirection by the target structure. The different offsets are applied in such a way that a corresponding plurality of different offsets are provided to reflected radiation derived from a first point of a pupil plane field distribution relative to reflected radiation derived from a second point of the pupil plane field distribution. A detection system 102 is provided that detects a corresponding plurality of radiation intensities resulting from interference between the reflected radiation derived from the first point of the pupil plane field distribution and the reflected radiation derived from the second point of the pupil plane field distribution. Each radiation intensity corresponds to a different one of the plurality of different offsets. Sets of radiation intensities resulting from interference between reflected radiation from a plurality of different pairs of first and second points in the pupil plane field distribution may be detected. Each set of radiation intensities comprises a radiation intensity for each of the plurality of different offsets. In an embodiment, each pair of points is positioned mirror symmetrically with respect to each other about the same line of mirror symmetry or point symmetrically with respect to each other about the same symmetry point. In an embodiment, at least two of the plurality of radiation intensities corresponding to the plurality of different offsets are measured at different times in the same measurement branch (as discussed below with reference to FIGS. 13-15 for example). This approach allows measurements to be made at multiple offsets using a compact apparatus. In an embodiment, at least two of the plurality of radiation intensities corresponding to the plurality of different offsets are measured simultaneously in different measurement branches (as discussed below with reference to FIGS. 16 and 17 for example). This approach allows measurements to be made quickly at multiple offsets.

The approach may be applied to any of the embodiments discussed above, including embodiments in which radiation from different points in the pupil plane field distribution are interfered using common path interferometry based architectures (such as in FIGS. 6 and 7) and/or OPS based architectures (such as in FIGS. 8 and 9). In one class of embodiments, the different offsets comprise different offsets in phase. In another class of embodiments, the different offsets comprise different offsets in amplitude. In another class of embodiments, the different offsets comprise a combination of amplitude and phase offsets.

As discussed in detail above, the interference between the radiation from different points in the pupil plane field distribution may be such that a component of the detected radiation intensity containing information about the parameter of interest is enhanced relative to one or more other components of the detected radiation intensity. In essence, the interference causes contributions from the one or more other components to at least partially cancel out by destructive interference. Applying an offset in phase or amplitude between radiation from the two different points adjusts the extent to which the cancellation occurs.

FIG. 10 depicts how a detected intensity I produced by the interference is expected to vary as a function of an applied phase bias 8 for three different overlay values. Curve 111 corresponds to zero overlay, curve 112 corresponds to a positive overlay, and curve 113 corresponds to a negative overlay. Each of the curves 111-113 takes the form $\cos(\pi+\text{bias})$ with a decay for larger biases due to limited temporal coherence. Phase asymmetry due to asymmetry in the target structure (e.g. overlay) shifts the curves to the left or right. The magnitude of the shift provides information about the magnitude of the asymmetry in the target structure. The direction of the shift provides information about the sign of the asymmetry in the target structure. In the particular example shown, positive overlay shifts the curve to the left (curve 112) and negative overlay shifts the curve to the right (curve 113).

Making multiple measurements of the interference intensity at different phase biases makes it possible to make a fit to the curve. An example plot of six such measurements is shown in FIG. 11. Fitting a curve to these points would indicate that the overlay of the target structure most closely matches the curve 112 in FIG. 10. Both the magnitude and sign of the target asymmetry can thus be obtained with high accuracy. The ability to match accurately to theoretically generated curves of interference intensity against applied amplitude and/or phase offset provides the basis more generally for determining more detailed information about the target structure being analyzed than would be possible without the use of multiple applied offsets.

In an embodiment, the different offsets comprise at least one offset in a first sense (e.g. increasing an amplitude of radiation from a first of two points contributing to interference relative to the second of the two points, or increasing a phase angle of radiation from the first point relative to the second point) and at least one offset in a second sense (e.g. decreasing an amplitude of radiation from the first point relative to the second point, or decreasing a phase angle of radiation from the first point relative to the second point), opposite to the first sense. In an embodiment, the two offsets are essentially equal in size to each other but opposite in sign. This approach allows the derivative of the curve of intensity against offset to be obtained accurately with a minimum of two offsets being needed.

FIG. 12 depicts an example approach in which two measurements have been made at points 114 and 115. Fitting a straight line 116 to the two points yields an estimate of the derivative of the curve at zero offset, which identifies that the target structure being measured most closely resembles the target structure corresponding to curve 112 (i.e. positive overlay). The derivative would have the opposite sign for negative overlay (curve 113), and thereby provides a sensitive measure of the sign of the detected asymmetry (in this case overlay) in the target structure. The derivative also provides information about the magnitude of the asymmetry (e.g. overlay). A larger derivative corresponds to more asymmetry (e.g. overlay).

The different offsets can be applied in various ways. Some examples are described below.

In one class of embodiments, the different offsets are at least partially defined by a polarization-dependent optical element 131. The polarization-dependent optical element 131 modifies an amplitude or phase of radiation passing through the polarization-dependent optical element 131 in dependence on the polarization of the radiation. In such embodiments, radiation from or forming the first point of the pupil plane field distribution passes through the polarization-dependent optical element 131 with a different polarization than radiation from or forming the second point of the pupil plane field distribution. The polarization-dependent optical element 131 can thus modify the radiation from the first point differently from the radiation from the second point and thereby apply the desired offset.

Figure 13:
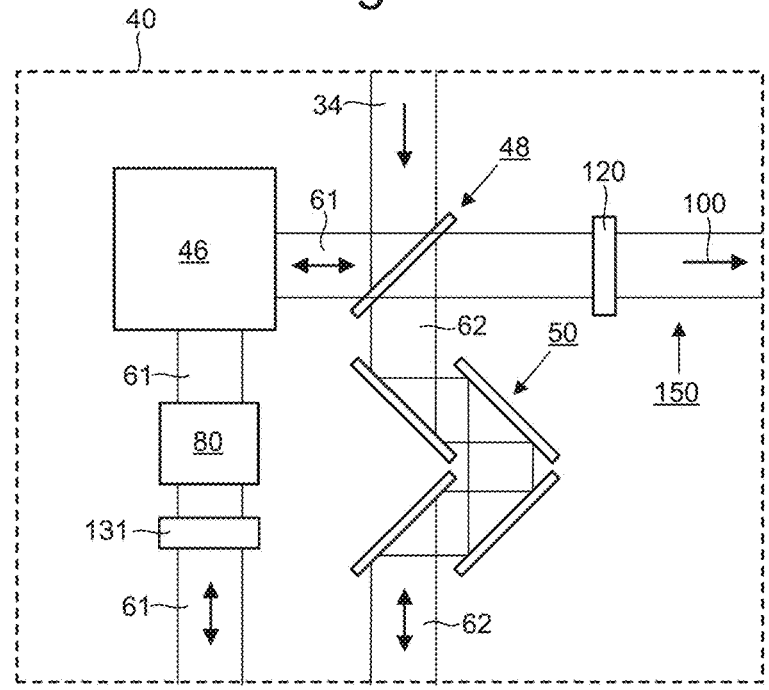
FIG. 13 schematically depicts an optical unit implementing common path interferometry and comprising a polarization-dependent optical element in the common path loop to apply amplitude and/or phase offsets.

FIG. 13 depicts an example implementation in which the optical unit 40 of FIG. 6 is modified to include a polarization-dependent optical element 131 in the first branch 61. The polarization-dependent optical element 131 could be positioned in the second branch 62. If the target structure at least partly converts the polarization of the radiation upon reflection (e.g. from a grating) and information about the parameter of interest is contained within the direction dependence of this polarization conversion, then polarization-dependent optical element 131 can apply an offset because the polarization properties of radiation propagating clockwise around the loop of FIG. 13 (i.e. down the second branch 62 and up the first branch 61) are potentially different at the polarization-dependent optical element 131 from the polarization properties of radiation propagating anticlockwise (i.e. down the first branch 61 and up the second branch 62). This is because the clockwise radiation encounters the polarization-dependent optical element 131 after redirection by the target structure, while the anticlockwise radiation encounters the polarization-dependent optical element 131 before redirection by the target structure. As an example, when the input radiation 34 is purely X-polarized, Y-polarized radiation will only be present in redirected radiation (due to the polarization conversion properties of the target structure). If the polarization-dependent optical element 131 retards Y-polarized radiation relative to X-polarized radiation this will thus affect only the clockwise traveling radiation, which encounters the polarization-dependent optical element 131 after redirection by the target structure (where a Y-polarization is present). The anticlockwise travelling radiation only passes through the polarization-dependent optical element 131 before redirection by the target, when no Y-polarization is present, and is not therefore retarded. This leads to an offset between the radiation in the clockwise and anticlockwise propagation directions. When the pupil plane field distributions are subsequently superimposed to cause interference (see distributions 71C and 72C in FIGS. 6 and 7), the applied offset constitutes an offset of an optical property (phase or amplitude) provided to reflected radiation derived from a first point of a pupil plane field distribution (e.g. from a point in the portion of the pupil plane field distribution labelled 71A defining the radiation incident onto the target structure, provided by anticlockwise radiation) relative to reflected radiation derived from a second point of the pupil plane field distribution (e.g. from a point in the portion of the pupil plane field distribution labelled 72A that is symmetrically opposite to the abovementioned point in the portion of the pupil plane field distribution labelled 71A, provided by the clockwise radiation). In the case where the offset comprises an offset in phase, the polarization-dependent optical element 131 may comprise a retarder as in the example above. In the case where the offset comprises an offset in amplitude, the polarization-dependent optical element 131 may comprise a diattenuator (also known as linear dichroic optics, polarization dependent loss optics, or a weak polarizer).

In an embodiment, the retarder is a variable retarder. Using a variable retarder allows the phase offset to be finely tuned easily and/or to be changed efficiently to substantially different values in order to apply a plurality of different phase offsets. The variable retarder may comprise a Soleil Babinet compensator, or a Pockels cell. A Pockels cell can be controlled on a nanosecond timescale. The use of a polarization-dependent optical element 131 positioned within the first branch 61 and/or second branch 62 can be implemented with minimal impact to alignment, due to the lack of a need for moving parts.

In the specific example of X-polarized input, the clockwise path X-polarized output $X_{out}$ and Y-polarized output $Y_{out}$, after passing through a polarizer 120, in the measurement branch 150 are given as follows (with contributions on the right of the equation being as follows, in order from right to left: input, beam splitter 48, target structure, retarder in polarization-dependent optical element 131, diattenuator in polarization-dependent optical element 131, beam splitter 48, polarizer 120):

$$\begin{bmatrix} X_{out} \\ Y_{out} \end{bmatrix} = \begin{bmatrix} 0 & 0 \\ 0 & 1 \end{bmatrix} \begin{bmatrix} T_x & 0 \\ 0 & T_y \end{bmatrix} \begin{bmatrix} a_x & 0 \\ 0 & a_y \end{bmatrix} \begin{bmatrix} e^{i\varphi_x} & 0 \\ 0 & e^{i\varphi_y} \end{bmatrix} \begin{bmatrix} R_{XX}^{+k} & R_{XY}^{+k} \\ R_{YX}^{+k} & R_{YY}^{+k} \end{bmatrix} \begin{bmatrix} T_x & 0 \\ 0 & T_y \end{bmatrix} \begin{bmatrix} 1 \\ 0 \end{bmatrix}$$

$$\begin{bmatrix} X_{out} \\ Y_{out} \end{bmatrix} = \begin{bmatrix} 0 \\ T_y a_y e^{i\varphi_y} R_{YX}^{+k} T_x \end{bmatrix}$$

Outputs from the anticlockwise path after passing through the polarizer 120 in the measurement branch 150 are given as follows (with contributions on the right of the equation being as follows, in order from right to left: input, beam splitter 48, diattenuator in polarization-dependent optical element 131, retarder in polarization-dependent optical element 131, target structure, beam splitter 48, polarizer 120):

$$\begin{bmatrix} X_{out} \\ Y_{out} \end{bmatrix} = \begin{bmatrix} 0 & 0 \\ 0 & 1 \end{bmatrix} \begin{bmatrix} R_x & 0 \\ 0 & R_y \end{bmatrix} \begin{bmatrix} R_{XX}^{-k} & R_{XY}^{-k} \\ R_{YX}^{-k} & R_{YY}^{-k} \end{bmatrix} \begin{bmatrix} e^{i\varphi_x} & 0 \\ 0 & e^{i\varphi_y} \end{bmatrix} \begin{bmatrix} a_x & 0 \\ 0 & a_y \end{bmatrix}$$

$$\begin{bmatrix} R_x e^{i\pi} & 0 \\ 0 & R_y e^{i\pi} \end{bmatrix} \begin{bmatrix} 1 \\ 0 \end{bmatrix}$$

$$\begin{bmatrix} X_{out} \\ Y_{out} \end{bmatrix} = \begin{bmatrix} 0 \\ R_y R_{YX}^{-k} e^{i(\varphi_x + \pi)} a_x R_x \end{bmatrix}$$

The intensity from interference of the recombined radiation is given as follows:

$$I_{interferometry}=(T_y a_y e^{i\varphi_y}R_{YX}^{+k}T_x+R_y R_{YX}^{-k}e^{i(\varphi_x+\pi)}a_x R_x)^2$$

In the embodiments discussed above, the beam splitter 48 has been a non-polarizing beam splitter. This may be appropriate in some embodiments because the asymmetry of interest (e.g. asymmetry due to overlay) is normally an asymmetry between $R_{XY}^{+k}$ and $R_{XY}^{-k}$ or between $R_{YX}^{+k}$ and $R_{YX}^{-k}$ (i.e. an asymmetry between reflection from opposite positions in the pupil plane field distribution, −k and +k, involving the same change in polarization from X to Y or from Y to X for both reflections). Replacing the beam splitter 48 with a polarizing beam splitter in arrangements such as those depicted in FIGS. 6 and 7 would normally lead to a measurement of $R_{YX}^{+k}$ vs $R_{XY}^{-k}$ or $R_{XY}^{+k}$ vs $R_{YX}^{-k}$, which would not be sensitive to asymmetry due to overlay due to reciprocity/time reversal reasons.

Figure 14:
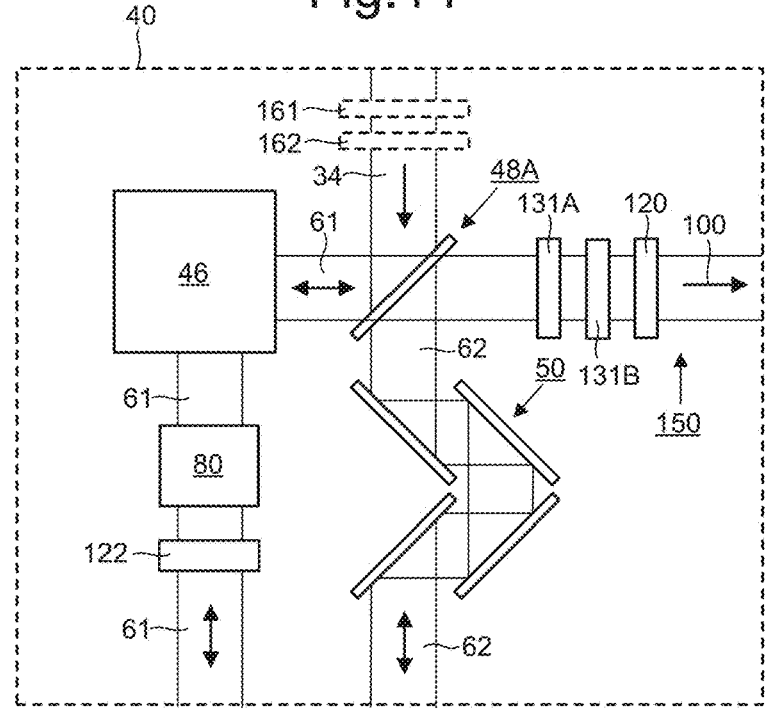
FIG. 14 schematically depicts an optical unit implementing common path interferometry and comprising a variable retarder and λ/2 plate after the common path loop to apply amplitude and/or phase offsets.

A polarizing beam splitter can be used, however, if combined with a λ/2 plate 122 as depicted in FIG. 14. The optical unit 40 of FIG. 14 is the same as the optical unit 40 depicted in FIG. 13 except for the following. The beam splitter 48 has been replaced by a polarizing beam splitter 48A. A λ/2 plate 122 oriented at 45° has been provided in the first branch 61 instead of the polarization-dependent optical element 131 (the λ/2 plate 122 oriented at 45° could be provided in the second branch 62 with the polarization-dependent optical element 131 omitted from the first branch 61). A variable retarder 131A and a further λ/2 plate 131B have been provided in the measurement branch 150 downstream from the polarizing beam splitter 48A.

The input radiation 34 in this embodiment has a polarization at 45° relative to the polarizing beam splitter 48A. This can be achieved by a polarizer, or a combination of a polarizer and a λ/2 plate at 45°. The polarizing beam splitter 48A will transmit 50% of the input radiation 34 and reflect 50% of the input radiation 34. In an example, X-polarized radiation is transmitted and Y-polarized radiation is reflected. The λ/2 plate 122 causes the Y-polarized radiation in this example to be converted to X-polarized radiation such that both the first branch 61 and the second branch 62 illuminate the target structure with X-polarized radiation. After interaction with the target structure, a portion of the radiation containing information about asymmetry (e.g. due to overlay) will be converted into Y-polarized radiation. In the clockwise direction, this Y-polarized radiation is converted into X-polarized radiation by the λ/2 plate 122, which is subsequently transmitted through the polarizing beam splitter 48A into the output branch. In the anticlockwise direction, the Y-polarized radiation from the target structure is reflected by the polarizing beam splitter 48A and also enters the output branch. Thus, radiation that has undergone polarization conversion at the target propagates towards the detection system along the output branch while radiation that has not been converted does not.

In the measurement branch 150 immediately downstream from the polarized beam splitter 48A the radiation from clockwise propagation in the loop formed by the first branch 61 and second branch 62 has X polarization. Radiation from anticlockwise propagation has Y polarization. The further λ/2 plate 131B is oriented at 22.5° to convert the X-polarized radiation to −45° polarization and convert the Y-polarized radiation to +45° polarization. The polarizer 120 (or, alternatively, a further polarizing beam splitter) is configured to project the −45° and +45° polarizations onto the X and/or Y axis, such that the radiation from the clockwise propagation can be made to interfere with the radiation from the anticlockwise propagation. The λ/2 plate 131B could also be left out if the polarizer 120 is oriented at +45°.

The above-described use of a polarizing beam splitter 48A opens up an alternative range of approaches for applying phase or amplitude offsets. In the example shown, a variable retarder 131A is positioned in the measurement branch 150. The radiation from the clockwise propagation has orthogonal polarization to the radiation from the anticlockwise propagation when passing through the variable retarder 131A, thereby allowing a phase offset to be applied to the radiation prior to interference. There are several options for applying amplitude offsets. For example, the λ/2 plate 131B in the measurement branch 150 could be rotated, resulting in the projection of the radiation onto the X and/or Y axes being at a ratio other than 50/50. The variable retarder 131A and the λ/2 plate 131B thus provide equivalent functionality to the polarization-dependent optical element 131 discussed above with reference to FIG. 13. In other embodiments, an amplitude offset is controlled by rotating the polarizer 120 instead of, or in addition to, rotating the λ/2 plate 131B. Alternatively or additionally, the polarization of the input radiation 34 could be tuned prior to reaching the polarizing beam splitter 48A, which would yield a splitting ratio other than 50:50 at the first reflection from the polarizing beam splitter 48A. The tuning of the polarization of the input radiation 34 could be achieved by rotation of a λ/2 plate 161 and/or polarizer 162 upstream of the polarizing beam splitter 48A. Thus, different offsets can be at least partially defined by different angles between the polarizing beam splitter 48A and either or both of a retarder (e.g. a λ/2 plate 161) and a polarizer 162.

Clockwise propagation through the loop formed by the first branch 61 and the second branch 62 in the example of FIG. 14 is given as follows (with contributions on the right of the equation being as follows, in order from right to left: input, polarizing beam splitter 48A, target structure, λ/2 plate 122, polarizing beam splitter 48A):

$$\begin{bmatrix} X_{out} \\ Y_{out} \end{bmatrix} = \begin{bmatrix} 1 & 0 \\ 0 & 0 \end{bmatrix}\begin{bmatrix} 0 & e^{-i\pi/2} \\ e^{-i\pi/2} & 0 \end{bmatrix}\begin{bmatrix} R_{XX}^{+k} & R_{XY}^{+k} \\ R_{YX}^{+k} & R_{YY}^{+k} \end{bmatrix}\begin{bmatrix} 1 & 0 \\ 0 & 0 \end{bmatrix}\begin{bmatrix} 1 \\ 1 \end{bmatrix}$$

$$\begin{bmatrix} X_{out} \\ Y_{out} \end{bmatrix} = \begin{bmatrix} R_{YX}^{+k} e^{-i\pi/2} \\ 0 \end{bmatrix}$$

Anticlockwise propagation is given as follows (with contributions on the right of the equation being as follows, in order from right to left: input, polarizing beam splitter 48A, λ/2 plate 122, target structure, polarizing beam splitter 48A):

$$\begin{bmatrix} X_{out} \\ Y_{out} \end{bmatrix} = \begin{bmatrix} 0 & 0 \\ 0 & e^{i\pi/2} \end{bmatrix}\begin{bmatrix} R_{XX}^{-k} & R_{XY}^{-k} \\ R_{YX}^{-k} & R_{YY}^{-k} \end{bmatrix}\begin{bmatrix} 0 & e^{-i\pi/2} \\ e^{-i\pi/2} & 0 \end{bmatrix}\begin{bmatrix} 0 & 0 \\ 0 & e^{i\pi/2} \end{bmatrix}\begin{bmatrix} 1 \\ 1 \end{bmatrix}$$

$$\begin{bmatrix} X_{out} \\ Y_{out} \end{bmatrix} = \begin{bmatrix} 0 \\ R_{YX}^{-k} e^{i\pi/2} \end{bmatrix}$$

In the measurement branch 150, output from radiation from clockwise propagation is given as follows (with contributions on the right of the equation being as follows, in order from right to left: input from clockwise contribution, variable retarder 131A, λ/2 plate 131B, polarizer 120):

$$\begin{bmatrix} X_{out} \\ Y_{out} \end{bmatrix} = \begin{bmatrix} 1 & 0 \\ 0 & 0 \end{bmatrix} e^{-i\pi/2} \begin{bmatrix} \cos(2\alpha) & \sin(2\alpha) \\ \sin(2\alpha) & -\cos(2\alpha) \end{bmatrix} \begin{bmatrix} e^{i\varphi_x} & 0 \\ 0 & e^{i\varphi_y} \end{bmatrix} \begin{bmatrix} R_{YX}^{+k} e^{-i\pi/2} \\ 0 \end{bmatrix}$$

$$\begin{bmatrix} X_{out} \\ Y_{out} \end{bmatrix} = \begin{bmatrix} \cos(2\alpha) R_{YX}^{+k} e^{i\varphi_x} e^{-i\pi} \\ 0 \end{bmatrix}$$

In the measurement branch 150, output from radiation from anticlockwise propagation is given as follows (with contributions on the right of the equation being as follows, in order from right to left: input from anticlockwise contribution, variable retarder 131A, λ/2 plate 131B, polarizer 120):

$$\begin{bmatrix} X_{out} \\ Y_{out} \end{bmatrix} = \begin{bmatrix} 1 & 0 \\ 0 & 0 \end{bmatrix} e^{-i\pi/2} \begin{bmatrix} \cos(2\alpha) & \sin(2\alpha) \\ \sin(2\alpha) & -\cos(2\alpha) \end{bmatrix} \begin{bmatrix} e^{i\varphi_x} & 0 \\ 0 & e^{i\varphi_y} \end{bmatrix} \begin{bmatrix} 0 \\ R_{YX}^{-k} e^{i\pi/2} \end{bmatrix}$$

$$\begin{bmatrix} X_{out} \\ Y_{out} \end{bmatrix} = \begin{bmatrix} \sin(2\alpha) R_{YX}^{-k} e^{i\varphi_y} \\ 0 \end{bmatrix}$$

The intensity from interference of the recombined radiation is given as follows:

$$I_{interferometry} = (\cos(2\alpha) R_{YX}^{+k} e^{i\varphi_x} e^{-i\pi} + \sin(2\alpha) R_{YX}^{-k} e^{i\varphi_y})^2$$

Thus, different phase offsets can be applied by setting different retardation amounts in the variable retarder 131A, which define the phases $\varphi_x$ and $\varphi_y$. Different amplitude offsets can be applied by setting different values for the orientation of the λ/2 plate 131B (which defines the angle α).

The above embodiments also show that different offsets can be at least partially defined by providing different splitting ratios of a beam splitter 48A. In the above example the different splitting ratio was achieved by rotating the polarization of radiation incident onto a polarizing beam splitter 48A. Several other possibilities exist. For example, varying phase and amplitude offsets can be applied by moving a gradient beam splitter.

Figure 15:
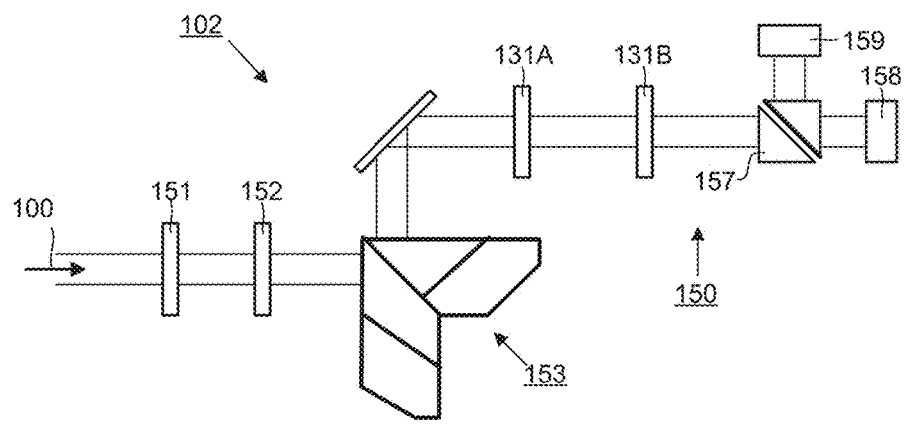
FIG. 15 schematically depicts a detection system comprising a self-referencing interferometer configured to receive radiation after redirection by a target structure and comprising a variable retarder and λ/2 plate to apply amplitude and/or phase offsets.

FIG. 15 depicts a further approach for applying the phase and/or amplitude offsets based on the interferometric principles of the OPS system discussed above with reference to FIG. 9. As in the embodiment of FIG. 9, and in contrast to the examples of FIGS. 13 and 14, in the embodiment of FIG. 15 the splitting and recombination of radiation to interfere radiation from different points in the pupil plane field distribution is performed entirely after redirection of the radiation by the target structure. The embodiment of FIG. 15 is similar to the embodiment of FIG. 9 except that functionality corresponding to the Mach Zehnder interferometer functionality of the first and second optical branches 81 and 82 of FIG. 9 is implemented by a self-referencing interferometer 153. Thus, the embodiment of FIG. 15 may be implemented in a metrology apparatus as described above with reference to FIGS. 4 and 5, except that the configuration of FIG. 4 may not comprise the aperture plate 13H to remove the first region of the pupil field distribution, the source 11 is configured to output spatially coherent radiation, the optical unit 40 in FIG. 5 has a single beam splitter, and the components shown in FIG. 15 are provided after the lens 18B shown in FIG. 5.

The self-referencing interferometer 153 comprises a compound prism that can be interpreted as a Mach Zehnder interferometer with polarizing beam splitters. In one arm of the self-referencing interferometer 153, the pupil plane field distribution and polarization are rotated by +90 degrees. In the other arm, the pupil plane field distribution and polarization are rotated by −90 degrees. The rotation is achieved by multiple reflections. The output of the self-referencing interferometer 153 comprises two superimposed copies of the pupil plane field distribution, rotated with respect to each other so that they are point symmetric. The two copies have orthogonal polarization relative to each other.

In the embodiment of FIG. 15, a polarizer 151 is provided that is crossed with respect to the polarization of the input radiation 34 into the optical system 40. The polarizer thus removes radiation that is co-polarized with respect to the input radiation 34 into the optical system 40. This may be useful for example where the parameter of interest is overlay, because information about overlay is expected to be present predominantly in radiation that is cross-polarized with respect to the input radiation 34 into the optical system 40. For other parameters of interest, information may be present in the co-polarized radiation and the polarizer 151 may be omitted in this case. A λ/2 plate 152 is positioned downstream from the polarizer 151 (where provided). In this embodiment, the λ/2 plate 152 is oriented at 22.5° to rotate the polarization of the radiation passing through the λ/2 plate 152 by 45°. The radiation then passes through the self-referencing interferometer 153 and is output to a measurement branch 150. The measurement branch 150 comprises a variable retarder 131A. The variable retarder 131A sets a phase difference between the two orthogonal polarizations. This can be used to compensate for unwanted path length differences in the self-referencing interferometer 153 or, as described below, to apply multiple different phase offsets. The measurement branch 150 further comprises a λ/2 plate 131B configured to rotate the polarization of the two copies by 45° (while maintaining the orthogonality of the polarizations). The output from the λ/2 plate 131B enters a polarizing beam splitter 157. The polarizing beam splitter 157 decomposes both copies of the pupil plane field distribution into two orthogonal polarization components, one of which is transmitted and the other reflected. The result is that the two copies of the pupil plane field distribution are made to interfere with each other. The interference is measured on either or both of the two detectors 158 and 159 (as described above with reference to FIG. 9 for similarly configured detectors 38A and 38B). For example, in detector 158, the radiation may be interfered destructively such that only the asymmetry signal (from reflection from asymmetric components of the target structure) remains (disregarding the effect of offsets). This causes a component of the detected radiation intensity containing information about a parameter of interest (e.g. overlay) to be enhanced relative to other components. In the detector 158, the radiation may be interfered constructively. This allows the detector 158 to detect a radiation intensity in which the component containing information about a parameter of interest (e.g. overlay) is suppressed relative to other components. The detector 158 can thus be used to measure the symmetric part of the pupil for example. The information about the parameter of interest (e.g. overlay) could therefore be obtained using only one of the two detectors 158,159, so it is not essential to provide both of the detectors 158,159.

The arrangement of FIG. 15 can be used to apply amplitude offsets. In an embodiment, the λ/2 plate 131B is made rotatable. Rotation of the λ/2 plate 131B away from the nominal 22.5° angle causes the splitting ratio of the polarizing beam splitter 157 to deviate from 50/50, which applies an amplitude offset to one copy of pupil plane field distribution relative to the other pupil plane field distribution, and thereby an amplitude offset between radiation from interfering pairs of points of the pupil plane field distribution detected by one of the detectors 158,159. Alternatively or additionally, the λ/2 plate 152 can be rotated to change the splitting ratio at the polarizing beam splitter in the self-referencing interferometer 153. The change in the splitting ratio at the polarizing beam splitter in the self-referencing interferometer 153 will also apply an amplitude offset.

The arrangement of FIG. 15 can be used to apply phase offsets. In an embodiment, the variable retarder 131A is used to set a phase difference between the two copies of the pupil plane field distribution that are polarized orthogonally relative to each other as they pass through the variable retarder 131A. The variable retarder 131A and the λ/2 plate 131B thus provide equivalent functionality to the variable retarder 131A and the λ/2 plate 131B of FIG. 14 and to the polarization-dependent optical element 131 of FIG. 13.

In an embodiment of FIG. 15, element 131A is a fixed retarder plate in which half of the pupil gets λ/4 retardation at 0° and the other half has no retardation. Further in the embodiment of FIG. 15, the polarizing element 157 is a Wollaston prism. This embodiment of FIG. 15 facilitates measurement of a parameter of interest in a single measurement step which comprises mixing 4 representatives of the pupils.

In a further embodiment of FIG. 15, a self-referencing interferometer is used in combination with a Wollaston prism. In this embodiment of FIG. 15, only 2 representative pupils are needed in order to calculate a parameter of interest.

Figure 16:
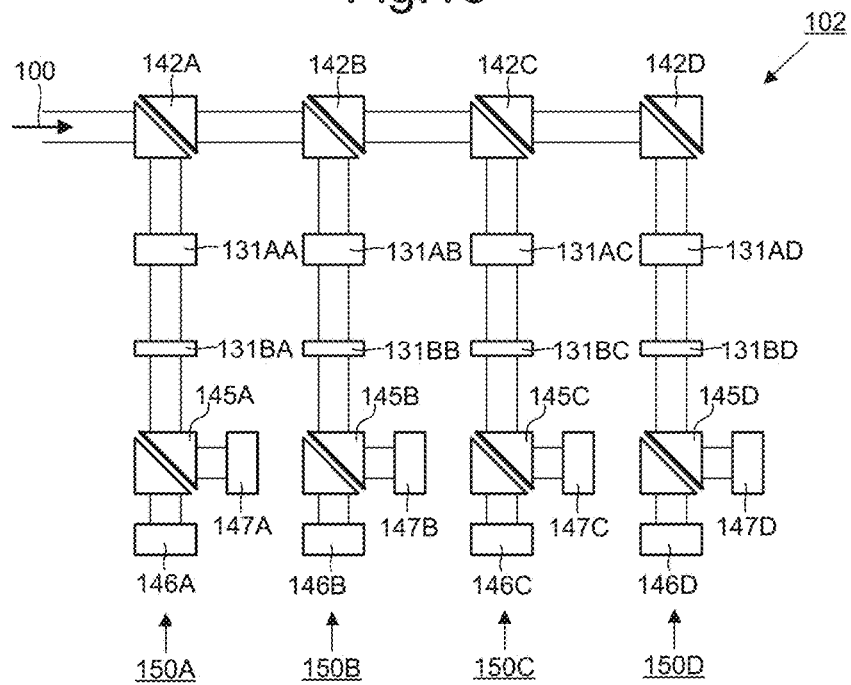
FIG. 16 schematically depicts a detection system configured to apply multiple different amplitude and/or phase offsets to radiation that has been subjected to common path interferometry.
Figure 17:
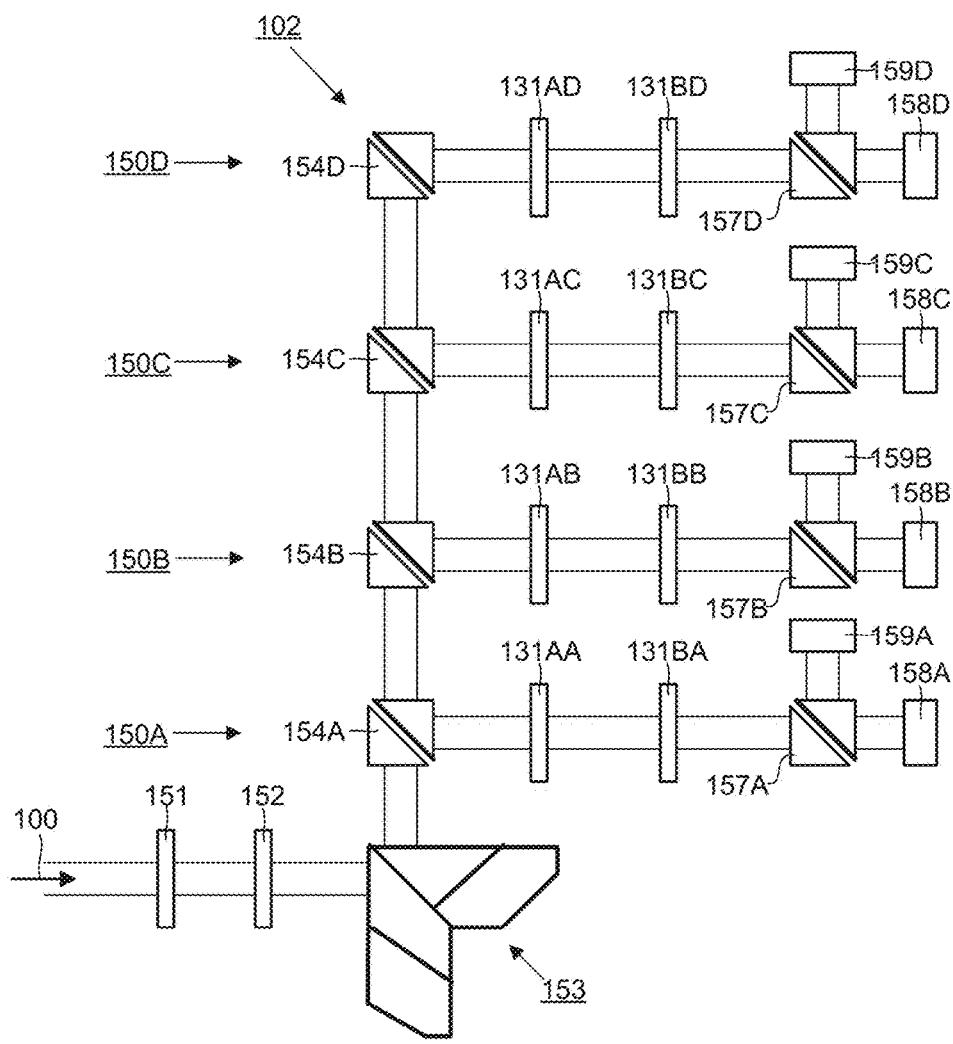
FIG. 17 schematically depicts a detection system configured to apply multiple different amplitude and/or phase offsets to radiation that has been subject to interference by a self-referencing interferometer.

Various arrangements for applying phase and/or amplitude offsets have been discussed above with reference to FIGS. 13-15. Multiple different phase and/or amplitude offsets can be applied at different times by changing settings of elements such as the variable retarder 131A and/or λ/2 plate 131B of FIGS. 14 and 15, or the polarization-dependent optical element 131 of FIG. 13. FIGS. 16 and 17 depict example implementations which allow measurements at multiple different amplitude and/or phase offsets to be achieved in parallel.

FIG. 16 depicts a detection system 102 configured to make measurements at multiple different amplitude and/or phase offsets in parallel using a configuration of the type depicted in FIG. 14 except that the functionality provided by the variable retarder 131A, the λ/2 plate 131B, and the polarizer 120 in the measurement branch 150 has been provided separately in a plurality of measurement branches 150A-D. Four beam splitters 142A-D are provided for distributing radiation output from the polarized beam splitter 48A (arrow 100) simultaneously between the four different measurement branches 150A-D. Within each measurement branch 150A-D, a variable retarder 131AA-AD and a λ/2 plate 131BA-BD are provided to perform the functionality of the variable retarder 131A and the λ/2 plate 131B of FIG. 14. In this embodiment, rather than being tuned differently at different moments in time to provide a plurality of different amplitude and/or phase offsets, the variable retarder 131AA-AD and λ/2 plate 131BA-BD in each measurement branch 150A-D is tuned to provide a different amplitude and/or phase offset relative to each of the other measurement branches 150A-D. The functionality of the polarizer 120 of FIG. 14 is provided in this embodiment by a polarizing beam splitter 145A-D in each measurement branch 150A-D. Outputs from the polarizing beam splitter 145A-D in each measurement branch 150A-D are detected by at least one detector 146A-D, 147A-D that detects a radiation intensity corresponding to the interference between radiation from different points in the pupil plane field distribution, with a particular amplitude and/or phase offset being applied that is different for each measurement branch 150A-D.

FIG. 17 depicts a detection system 102 configured to make measurements at multiple different amplitude and/or phase offsets in parallel using a configuration of the type depicted in FIG. 15 except that the functionality provided by the variable retarder 131A, the λ/2 plate 131B, the polarizing beam splitter 157, and the detectors 158 and 159 in the measurement branch 150 has been provided separately in a plurality of measurement branches 150A-D. Four beam splitters 142A-D are provided for distributing radiation output from the self-referencing interferometer 153 simultaneously between the four different measurement branches 150A-D. Within each measurement branch 150A-D, a variable retarder 131AA-AD and a λ/2 plate 131BA-BD are provided to perform the functionality of the variable retarder 131A and the λ/2 plate 131B of FIG. 15. In this embodiment, rather than being tuned differently at different moments in time to provide a plurality of different amplitude and/or phase offsets, the variable retarder 131AA-AD and the λ/2 plate 131BA-BD in each measurement branch 150A-D is tuned to provide a different amplitude and/or phase offset relative to each of the other measurement branches 150A-D. Outputs from the polarizing beam splitter 157A-D in each measurement branch 150A-D are detected by at least one detector 157A-D, 158A-D that detects a radiation intensity corresponding to the interference between radiation from different points in the pupil plane field distribution, with a particular amplitude and/or phase offset being applied that is different for each measurement branch 150A-D.

The above embodiments may be particularly usefully applied to measuring asymmetry in a target structure comprising a layered structure having a first component in a first layer and a second component in a second layer, in the case where a separation between the first layer and the second layer is greater than λ/20, where λ is a wavelength of the input radiation beam. This may be the case for example where the method is applied to a target structure after a lithographic development step but prior to a subsequent etching step. The increased sensitivity to asymmetry means that asymmetry (e.g. overlay between the first component and the second component) can be measured for high resolution structures even in cases such as these where the contribution to zeroth order reflection is expected to be extremely small (due to the large separation between the layers). Additionally or alternatively, measurement times can be reduced significantly.

The concepts disclosed herein may find utility beyond post-lithography measurement of structures for monitoring purposes. For example, such a detector architecture may be used in future alignment sensor concepts that are based on pupil plane detection, used in lithographic apparatuses for aligning the substrate during the patterning process.

The targets described above may be metrology targets specifically designed and formed for the purposes of measurement. However, the ability to measure high resolution targets means the embodiments may also be applied to targets that are functional parts of devices formed on the substrate. Many devices have regular, grating-like structures. The terms 'target grating' and 'target' as used herein do not require that the structure has been provided specifically for the measurement being performed.

The metrology apparatus can be used in a lithographic system, such as the lithographic cell LC discussed above with reference to FIG. 2. The lithographic system comprises a lithographic apparatus LA that performs a lithographic process. The lithographic apparatus may be configured to use the result of a measurement by the metrology apparatus of a structure formed by the lithographic process when performing a subsequently lithographic process, for example to improve the subsequent lithographic process.

An embodiment may include a computer program containing one or more sequences of machine-readable instructions describing methods of measuring targets on a structures and/or analyzing measurements to obtain information about a lithographic process. There may also be provided a data storage medium (e.g., semiconductor memory, magnetic or optical disk) having such a computer program stored therein. Where an existing lithography or metrology apparatus is already in production and/or in use, an embodiment of the invention can be implemented by the provision of updated computer program products for causing a processor to perform all or part of methods described herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that an embodiment of the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further embodiments are described in the below numbered clauses:

1. A metrology apparatus for measuring a structure formed on a substrate to determine a parameter of interest, the metrology apparatus comprising:
an optical system configured to focus radiation onto the structure and direct redirected radiation from the structure to a detection system, wherein:
the optical system is configured to apply a plurality of different offsets of an optical characteristic to radiation before and/or after redirection by the structure, such that a corresponding plurality of different offsets are provided to redirected radiation derived from a first point of a pupil plane field distribution relative to redirected radiation derived from a second point of the pupil plane field distribution; and
the detection system is configured to detect a corresponding plurality of radiation intensities resulting from interference between the redirected radiation derived from the first point of the pupil plane field distribution and the redirected radiation derived from the second point of the pupil plane field distribution, wherein each radiation intensity corresponds to a different one of the plurality of different offsets.

2. The apparatus of clause 1, wherein the interference is such that a component of the detected radiation intensity containing information about the parameter of interest is enhanced relative to one or more other components of the detected radiation intensity.

3. The apparatus of clause 1 or clause 2, wherein the different offsets comprise either or both of a different amplitude offset or a different phase offset.

4. The apparatus of any of clauses 1-3, wherein the different offsets comprise at least one offset in a first sense and at least one offset in a second sense, opposite to the first sense.

5. The apparatus of any preceding clause, wherein:
the different offsets are at least partially defined by a polarization-dependent optical element configured to modify an amplitude or phase of radiation passing through the polarization-dependent optical element in dependence on the polarization of the radiation; and
the optical system is configured such that radiation from or forming the first point of the pupil plane field distribution passes through the polarization-dependent optical element with a different polarization than radiation from or forming the second point of the pupil plane field distribution.

6. The apparatus of clause 5, wherein the polarization-dependent optical element comprises a retarder.

7. The apparatus of clause 6, wherein the retarder is a variable retarder.

8. The apparatus of any of clauses 5-7, wherein the polarization-dependent optical element comprises a diattenuator.

9. The apparatus of clause 8, wherein the diattenuator is a variable diattenuator.

10. The apparatus of any of clauses 1-9, wherein the optical system comprises a polarizing beam splitter and the different offsets are at least partially defined by different relative angles between the polarizing beam splitter and either or both of a retarder and polarizer.

11. The apparatus of any of clauses 1-10, wherein the different offsets are at least partially defined by different splitting ratios of a beam splitter.

12. The apparatus of any of clauses 1-11, wherein the optical system is configured to cause the detection system to detect sets of radiation intensities resulting from interference between redirected radiation from a plurality of different pairs of first and second points in the pupil plane field distribution, each set of radiation intensities comprising a radiation intensity for each of the plurality of different offsets.

13. The apparatus of clause 12, wherein each pair of points is positioned mirror symmetrically with respect to each other about the same line of mirror symmetry or point symmetrically with respect to each other about the same symmetry point.

14. The apparatus of any of clauses 1-13, wherein the optical system is configured to split a radiation beam into a plurality of radiation beams and later recombine the plurality of radiation beams in order to cause the interference between the redirected radiation from the first and second points of the pupil plane field distribution.

15. The apparatus of clause 14, wherein:
   the splitting of the radiation beam into the plurality of radiation beams creates multiple copies of a first pupil plane field distribution; and
   the optical system forms a second pupil plane field distribution using the multiple copies of the first pupil field distribution.
16. The apparatus of clause 15, wherein the multiple copies of the first pupil plane field distribution are rotated or flipped relative to each other to form the second pupil plane field distribution.
17. The apparatus of any of clauses 1-16, wherein the optical system comprises a beam splitter configured to split a radiation beam into a first radiation beam and a second radiation beam, and the optical system is configured such that the first radiation beam and the second radiation beam propagate in opposite directions around a common optical path comprising a first branch and a second branch, the first radiation beam propagating from the beam splitter to the substrate along the first branch and from the substrate back to the beam splitter along the second branch, and the second radiation beam propagating from the beam splitter to the substrate along the second branch and from the substrate back to the beam splitter along the first branch.
18. The apparatus of clause 17, wherein the optical system is configured to perform at least one flip or rotation of the pupil plane field distribution of radiation propagating in the first branch or the second branch such that the image from the first radiation beam and the image from the second radiation beam are respectively formed by radiation having pupil plane field distributions that are mirror symmetric or point symmetric with respect to each other.
19. The apparatus of clause 17 or clause 18, configured so that the radiation beam input to the beam splitter comprises a pupil plane field distribution in which a first region of the pupil plane field distribution has been removed to leave only a second region of the pupil plane field distribution.
20. The apparatus of clause 19, wherein the first region and the second region are oppositely oriented semicircles.
21. The apparatus of any of clauses 1-20, wherein at least two of the plurality of radiation intensities corresponding to the plurality of different offsets are measured simultaneously in different measurement branches.
22. The apparatus of any of clauses 1-21, wherein at least two of the plurality of radiation intensities corresponding to the plurality of different offsets are measured at different times in the same measurement branch.
23. The apparatus of any of clauses 1-22, wherein the parameter of interest comprises overlay.
24. A lithographic system comprising:
   a lithographic apparatus configured to perform a lithographic process; and
   the metrology apparatus of any of clauses 1-23.
25. A method of measuring a structure formed on a substrate to determine a parameter of interest, the method comprising:
   focusing radiation onto the structure and using a detection system to detect redirected radiation from the structure, wherein
   a plurality of different offsets of an optical characteristic are applied to radiation before and/or after redirection by the structure, such that a corresponding plurality of different offsets are provided to redirected radiation derived from a first point of a pupil plane field distribution relative to redirected radiation derived from a second point of the pupil plane field distribution; and
   the detection system detects a corresponding plurality of radiation intensities resulting from interference between the redirected radiation derived from the first point of the pupil plane field distribution and the redirected radiation derived from the second point of the pupil plane field distribution, wherein each radiation intensity corresponds to a different one of the plurality of different offsets.
26. The method of clause 25, wherein at least two of the plurality of radiation intensities corresponding to the plurality of different offsets are measured simultaneously.
27. The method of clause 25 or clause 26, wherein at least two of the plurality of radiation intensities corresponding to the plurality of different offsets are measured at different times.
28. The method of clause 27, wherein either or both of a variable retarder and a variable diattenuator are used to change an offset applied to the redirected radiation from the first point relative to the redirected radiation from the second point between the measurements made at different times.
29. The method of any of clauses 25-28, wherein the method is applied to a structure after a lithographic development step but prior to a subsequent etching step.
30. The method of any of clauses 25-29, wherein the parameter of interest comprises an asymmetry in the structure.
31. The method of any of clauses 25-30, wherein the parameter of interest comprises overlay.
32. The method of any of clauses 25-31, wherein the detected radiation intensities result from zeroth order reflection from the structure.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic, and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A metrology apparatus configured to measure a structure formed on a substrate to determine a parameter of interest, the metrology apparatus comprising:
   an optical system configured to focus radiation onto the structure and direct redirected radiation from the structure to a detection system, wherein:
   the optical system is configured to apply a plurality of different offsets of an optical characteristic to radiation before and/or after redirection by the structure, such that a corresponding plurality of different offsets are provided to redirected radiation derived from a first point of a pupil plane field distribution relative to redirected radiation derived from a second point of the pupil plane field distribution; and the detection system is configured to detect a corresponding plurality of radiation intensities resulting from interference between the redirected radiation derived from the first point of the pupil plane field distribution and the redirected radiation derived from the second point of the pupil plane field distribution, wherein each radiation intensity corresponds to a different one of the plurality of different offsets.

2. The apparatus of claim 1, wherein the interference is such that a component of the detected radiation intensity containing information about the parameter of interest is enhanced relative to one or more other components of the detected radiation intensity.

3. The apparatus of claim 1, wherein the different offsets comprise either or both of a different amplitude offset or a different phase offset.

4. The apparatus of claim 1, wherein the different offsets comprise at least one offset in a first sense and at least one offset in a second sense, opposite to the first sense.

5. The apparatus of claim 1, wherein:
the different offsets are at least partially defined by a polarization-dependent optical element configured to modify an amplitude or phase of radiation passing through the polarization-dependent optical element in dependence on the polarization of the radiation; and
the optical system is configured such that radiation from or forming the first point of the pupil plane field distribution passes through the polarization-dependent optical element with a different polarization than radiation from or forming the second point of the pupil plane field distribution.

6. The apparatus of claim 1, wherein the optical system comprises a polarizing beam splitter and the different offsets are at least partially defined by different relative angles between the polarizing beam splitter and either or both of a retarder and polarizer.

7. The apparatus of claim 1, wherein the different offsets are at least partially defined by different splitting ratios of a beam splitter.

8. The apparatus of claim 1, wherein the optical system is configured to cause the detection system to detect sets of radiation intensities resulting from interference between redirected radiation from a plurality of different pairs of first and second points in the pupil plane field distribution, each set of radiation intensities comprising a radiation intensity for each of the plurality of different offsets.

9. The apparatus of claim 1, wherein the optical system is configured to split a radiation beam into a plurality of radiation beams and later recombine the plurality of radiation beams in order to cause the interference between the redirected radiation from the first and second points of the pupil plane field distribution.

10. The apparatus of claim 1, wherein the optical system comprises a beam splitter configured to split a radiation beam into a first radiation beam and a second radiation beam, and the optical system is configured such that:
the first radiation beam and the second radiation beam propagate in opposite directions around a common optical path comprising a first branch and a second branch, the first radiation beam propagating from the beam splitter to the substrate along the first branch and from the substrate back to the beam splitter along the second branch, and the second radiation beam propagating from the beam splitter to the substrate along the second branch and from the substrate back to the beam splitter along the first branch.

11. The apparatus of claim 1, wherein at least two of the plurality of radiation intensities corresponding to the plurality of different offsets are measured simultaneously in different measurement branches.

12. The apparatus of claim 1, wherein at least two of the plurality of radiation intensities corresponding to the plurality of different offsets are measured at different times in the same measurement branch.

13. The apparatus of claim 1, wherein the parameter of interest comprises overlay.

14. A lithographic system comprising:
a lithographic apparatus configured to perform a lithographic process; and
the metrology apparatus of claim 1.

15. A method of measuring a structure formed on a substrate to determine a parameter of interest, the method comprising:
focusing radiation onto the structure and using a detection system to detect redirected radiation from the structure, wherein:
a plurality of different offsets of an optical characteristic are applied to radiation before and/or after redirection by the structure, such that a corresponding plurality of different offsets are provided to redirected radiation derived from a first point of a pupil plane field distribution relative to redirected radiation derived from a second point of the pupil plane field distribution; and
the detection system detects a corresponding plurality of radiation intensities resulting from interference between the redirected radiation derived from the first point of the pupil plane field distribution and the redirected radiation derived from the second point of the pupil plane field distribution, wherein each radiation intensity corresponds to a different one of the plurality of different offsets.

16. The method of claim 15, wherein at least two of the plurality of radiation intensities corresponding to the plurality of different offsets are measured simultaneously.

17. The method of claim 15, wherein at least two of the plurality of radiation intensities corresponding to the plurality of different offsets are measured at different times.

18. The method of claim 15, wherein the parameter of interest comprises an asymmetry in the structure.

19. The method of claim 15, wherein the parameter of interest comprises overlay.

20. The method of claim 15, wherein the detected radiation intensities result from zeroth order reflection from the structure.

* * * * *